United States Patent
Kusama et al.

(10) Patent No.: US 9,356,516 B2
(45) Date of Patent: May 31, 2016

(54) DRIVING APPARATUS AND ELECTRIC POWER CONVERTER

(71) Applicant: Panasonic Intellectual Property Management Co., Ltd., Osaka (JP)

(72) Inventors: Fumito Kusama, Osaka (JP); Hajime Hida, Osaka (JP); Shun Kazama, Osaka (JP); Kenji Hanamura, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 14/530,737

(22) Filed: Nov. 1, 2014

(65) Prior Publication Data

US 2015/0137857 A1 May 21, 2015

(30) Foreign Application Priority Data

Nov. 15, 2013 (JP) ................. 2013-237119

(51) Int. Cl.
| | |
|---|---|
| H03K 3/00 | (2006.01) |
| H02M 3/158 | (2006.01) |
| H02M 1/08 | (2006.01) |
| H03K 17/0412 | (2006.01) |
| H02M 1/00 | (2006.01) |
| H02M 7/5387 | (2007.01) |

(52) U.S. Cl.
CPC ............... *H02M 3/158* (2013.01); *H02M 1/08* (2013.01); *H03K 17/04123* (2013.01); *H02M 7/5387* (2013.01); *H02M 2001/0054* (2013.01); *H03K 2217/009* (2013.01); *H03K 2217/0036* (2013.01); *Y02B 70/1491* (2013.01)

(58) Field of Classification Search
CPC ......... H02M 1/32; H02M 1/34; H02M 3/158; H02M 7/5387; H02M 3/33546; H02M 7/483; H03K 17/145; H03K 17/04; H03K 17/162; H03K 17/168; H03K 17/687
USPC .......................... 327/108, 109, 110, 111, 112
See application file for complete search history.

(56) References Cited

U.S. PATENT DOCUMENTS

| | | | |
|---|---|---|---|
| 2011/0221480 A1* | 9/2011 | Ikeda | ............... H03K 17/04123 327/109 |
| 2012/0068683 A1* | 3/2012 | Liu | ......................... H02M 1/08 323/311 |

FOREIGN PATENT DOCUMENTS

| | | |
|---|---|---|
| JP | 09-201054 | 7/1997 |
| JP | 10-052061 | 2/1998 |
| JP | 2007-501544 | 1/2007 |
| WO | 2005/013487 | 2/2005 |

* cited by examiner

*Primary Examiner* — John Poos
(74) *Attorney, Agent, or Firm* — McDermott Will & Emery LLP

(57) ABSTRACT

A driving apparatus includes a first potential line that applies a first potential, a second potential line that applies a second potential, a coil including a first terminal and a second second terminal that is connected to a control terminal of a switching element, a charging switch connected between the first potential line and the first terminal of the coil, a clamp switch provided between the first potential line and the second terminal of the coil, a reverse-flow blocking diode connected in series with the clamp switch between the first potential line and the second terminal of the coil, and a control circuit that controls the charging switch and the clamp switch.

20 Claims, 22 Drawing Sheets

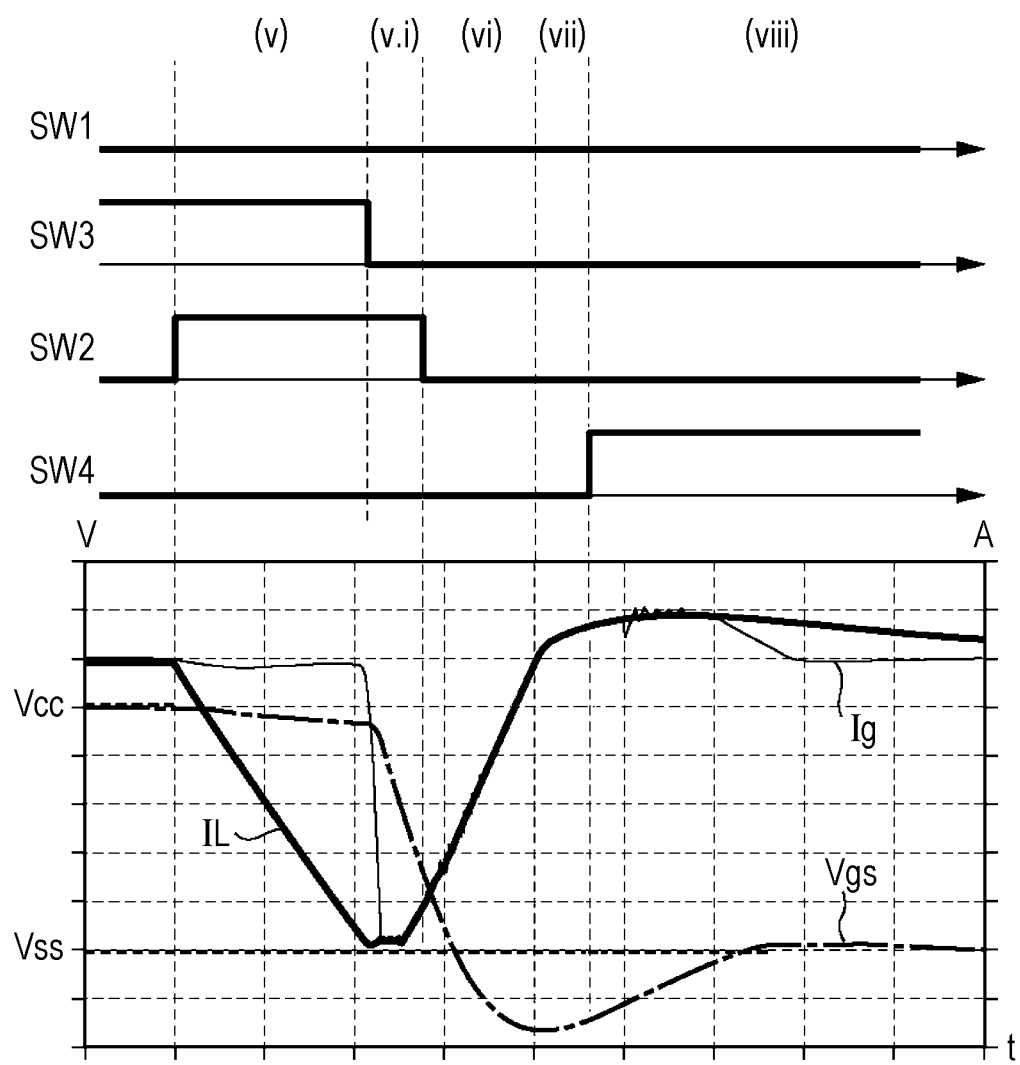

DRIVING APPARATUS AND ELECTRIC POWER CONVERTER

CROSS REFERENCES TO RELATED APPLICATIONS

This application claims priority to Japanese Patent Application No. 2013-237119, filed on Nov. 15, 2013, the contents of which are hereby incorporated by reference.

BACKGROUND

1. Technical Field

The present disclosure relates to a driving apparatus for driving a switching element having a control terminal and to an electric power converter having the driving apparatus.

2. Description of the Related Art

In recent years, driving apparatuses for driving power switching elements having large gate capacitances and used for high power have required a reduction in loss and an improvement in switching speed.

Typical drive systems for switching elements include a resistor-capacitor (RC) system and an inductor-capacitor (LC) system. In the RC system, a resistor provided between a power source and a gate terminal is used as a current-control element. In the LC system, a coil is used as a current-control element (see, for example, U.S. Patent Application Publication No. 2006/192437). Power loss of a driving apparatus with the RC system increases as the gate capacitance increases, as the gate voltage increases, or as the switching frequency increases. Power loss of a driving apparatus with the LC system can be reduced even when the gate capacitance is large, because the gate voltage is increased or reduced through LC resonance.

SUMMARY

For known driving apparatuses, there are demands for efficient switching. The present disclosure provides a driving apparatus that can achieve efficient switching. A driving apparatus according to one aspect of the present disclosure is directed to a driving apparatus for driving a switching element including a control terminal. The driving apparatus includes: a first potential line that applies a first potential; a second potential line that applies a second potential lower than the first potential; a coil including a first terminal and a second terminal, the second terminal being connected to the control terminal of the switching element; a charging switch, connected between the first potential line and the first terminal of the coil, to turn on or off electrical connection between the first potential line and the coil; a clamp switch, provided between the first potential line and the second terminal of the coil, to turn on or off electrical connection between the first potential line and the control terminal of the switching element; a reverse-flow blocking diode, connected in series with the clamp switch between the first potential line and the second terminal of the coil, to block current from the second terminal of the coil toward the first potential line; and a control circuit that controls the charging switch and the clamp switch.

This comprehensive and specific aspect may be realized as an electric power converter, a motor drive system, a vehicle, an electricity storage system, a control circuit, or a control method or may be realized by any combination thereof.

According to the present disclosure, it is possible to achieve efficient switching.

Additional benefits and advantages of the disclosed embodiments will be apparent from the specification and drawings. The benefits and/or advantages may be individually provided by the various embodiments and features of the specification and drawings, and need not all be provided in order to obtain one or more of the same.

BRIEF DESCRIPTION OF THE DRAWINGS

FIG. 9 illustrates a timing chart of control signals and a result of simulation in control method 2 according to the first embodiment;

Figure 1:
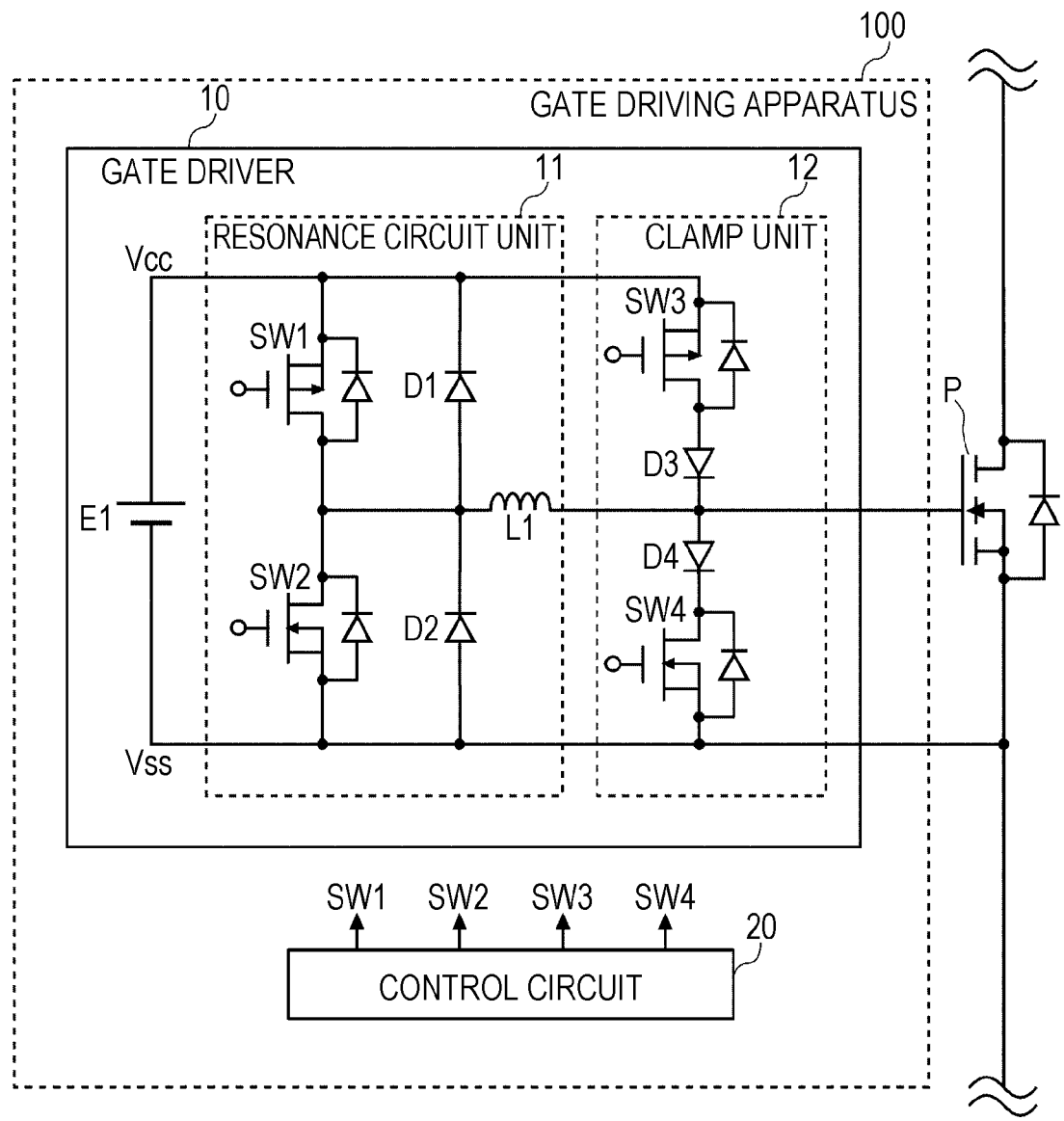
FIG. 1 illustrates an example configuration of a gate driving apparatus according to a first embodiment.

DETAILED DESCRIPTION OF THE DISCLOSURE (Underlying Knowledge Forming Basis of the Present Disclosure)

The present inventors have made intensive and extensive research on a driving apparatus that can achieve efficient switching.

An increase in gate current supplied to the gate terminal of a switching element improves the charging rate of a gate capacitance, thus making it possible to reduce switching loss of the switching element. Accordingly, in order to increase gate current of an LC system driving apparatus, the present inventors have paid attention to a method for precharging a coil before gate current is supplied to the gate terminal of the switching element. As a result, the present inventors have conceived one aspect of the present disclosure as a technology for improving switching characteristics in the driving apparatus having a precharge system.

(Overview of Embodiments)

A driving apparatus according to one aspect of the present disclosure is directed to a driving apparatus for driving a switching element including a control terminal. The driving apparatus includes: a first potential line that applies a first potential: a second potential line that applies a second potential lower than the first potential; a coil including a first terminal and a second terminal, the second terminal being connected to the control terminal of the switching element; a charging switch, connected between the first potential line and the first terminal of the coil, to turn on or off electrical connection between the first potential line and the coil; a clamp switch, provided between the first potential line and the second terminal of the coil, to turn on or off electrical connection between the first potential line and the control terminal of the switching element; a reverse-flow blocking diode, connected in series with the clamp switch between the first potential line and the second terminal of the coil, to block current from the second terminal of the coil toward the first potential line; and a control circuit that controls the charging switch and the clamp switch.

Since the reverse-flow blocking diode blocks current flowing from the second terminal of the coil toward the first potential line, current flowing from the first terminal of the coil to the second terminal can be efficiently supplied to the control terminal of the switching element. As a result, current supplied to the control terminal of the switching element can increase, thereby improving the switching speed of the switching element. Also, since current from the second terminal of the coil toward first potential line is blocked, electric power loss in the driving apparatus can be reduced.

In the driving apparatus according to the aspect of the present disclosure, for example, the switching element may further include a first conductive terminal, a second conductive terminal, and a capacitor between the control terminal and the first conductive terminal; and the coil and the capacitor may generate resonance current flowing therebetween.

In the driving apparatus according to the aspect of the present disclosure, for example, before current flows from the driving apparatus to the control terminal of the switching element, the control circuit may cause energy to be stored in the coil.

Since the coil is precharged before current flows to the control terminal of the switching element, the amount of current that flows to the control terminal of the switching element can increase, thereby making it possible to improve the switching efficiency.

In the driving apparatus according to the aspect of the present disclosure, for example, the control circuit may output control signals. The control signals may turn on the charging switch, and then turn off the charging switch after energy is stored in the coil.

Since the coil is precharged before current flows to the control terminal of the switching element, the amount of current that flows to the control terminal of the switching element can increase, thereby making it possible to improve the switching efficiency.

In the driving apparatus according to the aspect of the present disclosure, for example, the control signals may further turn on the clamp switch, after the charging switch is turned off and after a potential of the control terminal of the switching element reaches the first potential.

As a result of turning on the clamp switch, the control terminal of the switching element can be fixed to the first potential. This can stabilize current flowing through the switching element.

In the driving apparatus according to the aspect of the present disclosure, for example, the clamp switch may include a parasitic diode that passes current from the second terminal of the coil toward the first potential line.

When the clamp switch includes a parasitic diode, the reverse-flow blocking diode can block current flowing into the parasitic diode. Thus, current flowing from the first terminal of the coil to the second terminal can be efficiently supplied to the control terminal of the switching element. This can improve the switching speed of the switching element, and can reduce electric power loss in the driving apparatus.

In the driving apparatus according to the aspect of the present disclosure, for example, the clamp switch may be a first clamp switch; the driving apparatus may further include a charging diode, connected between the second potential line and the first terminal of the coil, to pass current from the second potential line to the first terminal of the coil, and a second clamp switch, provided between the second potential line and the second terminal of the coil, to turn on or off electrical connection between the second potential line and the control terminal of the switching element; and the control circuit may further control the second clamp switch.

In the driving apparatus according to the aspect of the present disclosure, for example, the control circuit may output control signals. The control signals may turn on the charging switch, and then the second clamp switch and to turn off the charging switch and the second clamp switch after energy is stored in the coil.

In the driving apparatus according to the aspect of the present disclosure, for example, the switching element may further include a first conductive terminal, a second conductive terminal, and a capacitor between the control terminal and the first conductive terminal; when the charging switch and the second clamp switch are on, current may flow from the first potential line to the second potential line via the charging switch, the coil, and the second clamp switch; and when the charging switch and the second clamp switch are off, current flowing through the coil may charge the capacitor.

As a result of turning on the charging switch and the second clamp switch, energy is precharged in the coil. Thus, the amount of current that flows to the control terminal of the switching element can increase, thus making it possible to improve the switching efficiency.

In the driving apparatus according to the aspect of the present disclosure, for example, the control signals may further turn on the first clamp switch, after the charging switch and the second clamp switch are turned off and after a potential of the control terminal of the switching element reaches the first potential.

As a result of turning on the clamp switch, the control terminal of the switching element can be fixed to the first potential. This can stabilize current flowing through the switching element.

In the driving apparatus according to the aspect of the present disclosure, for example, the reverse-flow blocking diode may be a first reverse-flow blocking diode; the driving apparatus may further include a discharging switch, connected between the second potential line and the first terminal of the coil, to turn on or off electrical connection between the second potential line and the coil, a discharging diode, connected between the first potential line and the first terminal of the coil, to pass current from the first terminal of the coil to the first potential line, and a second reverse-flow blocking diode, connected in series with the second clamp switch between the second potential line and the second terminal of the coil, to block current from the second potential line toward the second terminal of the coil; and the control circuit may further control the discharging switch.

Since the second reverse-flow blocking diode blocks current from the second potential line toward the second terminal of the coil, current flowing from the second terminal of the coil to the first terminal can cause electric charge to be efficiently pulled out from the control terminal of the switching element. Thus, the amount of electric charge pulled out from the control terminal of the switching element can increase, and the switching speed of the switching element can improve. Also, since current from the second potential line toward the second terminal of the coil is blocked, electric power loss in the driving apparatus can be reduced.

In the driving apparatus according to the aspect of the present disclosure, for example, before current flows from the control terminal of the switching element to the driving apparatus, the control circuit may cause energy to be stored in the coil.

Since the coil is precharged before current flows from the control terminal of the switching element to the driving apparatus, the amount of current that flows from the control terminal of the switching element to the driving apparatus can increase, thereby making it possible to improve the switching efficiency.

In the driving apparatus according to the aspect of the present disclosure, for example, the control circuit may output control signals. The control signals may turn on the discharging switch and the first clamp switch, and then turn off the discharging switch and the first clamp switch after energy is stored in the coil.

In the driving apparatus according to the aspect of the present disclosure, for example, the switching element may further include a first conductive terminal, a second conductive terminal, and a capacitor between the control terminal and the first conductive terminal; when the discharging switch and the first clamp switch are on, current may flow from the first potential line to the second potential line via the first clamp switch, the coil, and the discharging switch; and when the discharging switch and the first clamp switch are off, current flowing through the coil may discharge the capacitor.

As a result of turning on the discharging switch and the first clamp switch, energy is precharged in the coil. Thus, the amount of current that flows from the control terminal of the switching element to the driving apparatus can increase, thus making it possible to improve the switching efficiency.

In the driving apparatus according to the aspect of the present disclosure, for example, the control signals may further turn on the second clamp switch, after the discharging switch and the first clamp switch are turned off and after a potential of the control terminal of the switching element reaches the second potential.

As a result of turning on the second clamp switch, the control terminal of the switching element is fixed to the second potential. This can stabilize current flowing through the switching element.

In the driving apparatus according to the aspect of the present disclosure, for example, the switching element may further include a first conductive terminal and a second conductive terminal; and the driving apparatus may further comprise an auxiliary power source, provided between the second potential line and the first conductive terminal of the switching element, to increase a potential of the first conductive terminal of the switching element to be higher than a potential of the second potential line.

With this arrangement, the control terminal of the switching element and the second potential line are electrically connected, and thereby a negative voltage is applied between the control terminal of the switching element and the first conductive terminal.

An electric power converter according to one aspect of the present disclosure is, for example, an electric power converter that converts input electric power into output electric power, and includes the switching element and any one of the driving apparatuses that drive the switching element.

A driving apparatus according to another aspect of the present disclosure is directed to a driving apparatus for driving a switching element including a control terminal. The driving apparatus includes: a first potential line that applies a first potential: a second potential line that applies a second potential lower than the first potential; a coil including a first terminal and a second terminal, the second terminal being connected to the control terminal of the switching element; a discharging switch connected between the second potential line and the first terminal of the coil to turn on or off electrical connection between the second potential line and the coil; a clamp switch provided between the second potential line and the second terminal of the coil to turn on or off electrical connection between the second potential line and the control terminal of the switching element; a reverse-flow blocking diode connected in series with the clamp switch between the second potential line and the second terminal of the coil to block current from the second potential line toward the second terminal of the coil; and a control circuit that controls the discharging switch and the clamp switch.

Since the reverse-flow blocking diode blocks current from the second potential line toward the second terminal of the coil, current flowing from the second terminal of the coil to the first terminal can cause electric charge to be efficiently pulled out from the control terminal of the switching element. Thus, the amount of electric charge pulled out from the control terminal of the switching element can increase, and the switching speed of the switching element can improve. Also, since current from the second potential line toward the second terminal of the coil is blocked, electric power loss in the driving apparatus can be reduced.

In the driving apparatus according to the other aspect of the present disclosure, for example, before current flows from the control terminal of the switching element to the driving apparatus, the control circuit may cause energy to be stored in the coil.

Since the coil is precharged before current flows from the control terminal of the switching element to the driving apparatus, the amount of current that flows from the control terminal of the switching element to the driving apparatus can increases, thereby making it possible to improve the switching efficiency.

A driving apparatus according to yet another aspect of the present disclosure is directed to a driving apparatus for driving a switching element including a control terminal. The driving apparatus includes: a first potential line that applies a first potential; a second potential line that applies a second potential lower than the first potential; a third potential line that applies a third potential lower than the first potential and higher than the second potential; a coil including a first terminal and a second terminal, the second terminal being connected to the control terminal of the switching element; a charging switch provided between the third potential line and the first terminal of the coil to turn on or off electrical connection between the third potential line and the coil; a clamp switch provided between the first potential line and the second terminal of the coil to turn on or off electrical connection between the first potential line and the control terminal of the switching element; a reverse-flow blocking diode connected in series with the clamp switch between the first potential line and the second terminal of the coil to block current from the second terminal of the coil toward the first potential line; and a control circuit that controls the charging switch and the clamp switch.

Since the reverse-flow blocking diode blocks current flowing from the second terminal of the coil toward the first potential line, current flowing from the first terminal of the coil to the second terminal can be efficiently supplied to the control terminal of the switching element. As a result, current supplied to the control terminal of the switching element can increase, thereby improving the switching speed of the switching element. Also, since current from the second terminal of the coil toward first potential line is blocked, electric power loss in the driving apparatus can be reduced.

Embodiments will be described below with reference to the accompanying drawings. In all of the accompanying drawings, the same or corresponding portions are denoted by the same reference numerals, and redundant descriptions may be omitted.

The embodiments described below represent comprehensive or specific examples. Numerical values, shapes, materials, components, the arrangement of components, forms of connection, waveforms, and so on described in the embodiments below are merely examples, and are not intended to limit the present disclosure. Of the components in the embodiments described below, the components not set forth in the independent claims will be described as optional components.

First Embodiment

Overall Configuration of Gate Driving Apparatus

Figure 3A:
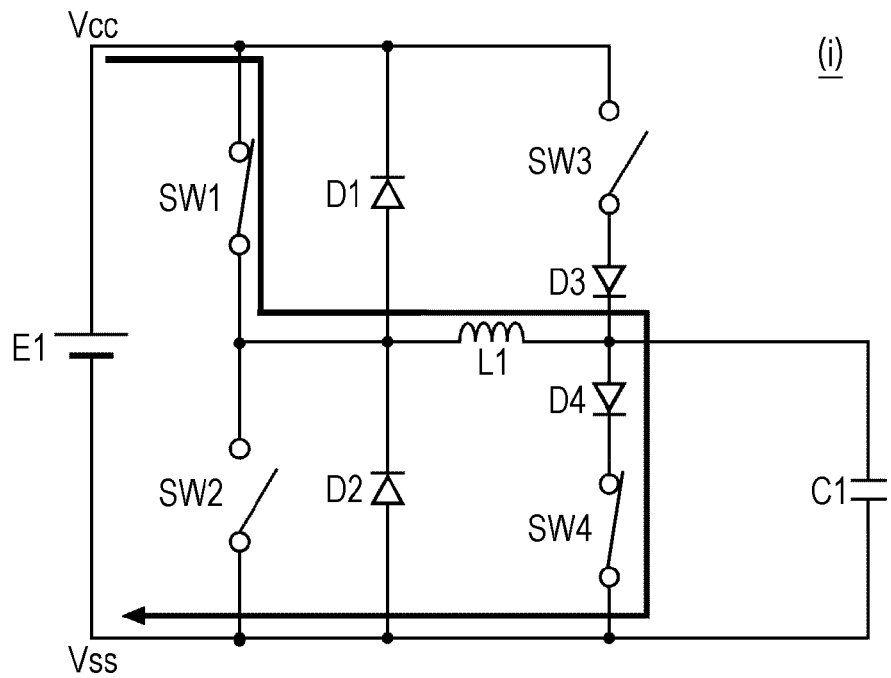
FIGS. 3A and 3B illustrate current paths in control method 1 illustrated in FIG. 2.

FIG. 1 illustrates an example configuration of a gate driving apparatus 100 according to a first embodiment. The gate driving apparatus 100 drives a voltage-controlled power switching element P in accordance with control signals generated by resonance. The voltage-controlled power switching element P may be a power switching element having a gate that can be regarded as a capacitor. The power switching element P may be, for example, a metal-oxide-semiconductor field-effect transistor (MOSFET) or an insulated-gate bipolar transistor (IGBT). In FIG. 3A and the subsequent drawings, an input capacitance Ciss of the voltage-controlled power switching element P may be depicted as a capacitor C1 in an equivalent circuit. The capacitor C1 may be constituted by the input capacitance Ciss of the power switching element P and another parasitic capacitor, as described below.

The power switching element P has a control terminal, a first conductive terminal, and a second conductive terminal. For example, when the power switching element P is a MOSFET, the control terminal is a gate terminal, one of the first conductive terminal and the second conductive terminal is a source terminal, and the other is a drain terminal. For example, when the power switching element P is an IGBT, the control terminal is a gate terminal, one of the first conductive terminal and the second conductive terminal is a collector terminal, and the other is an emitter terminal. One of the first conductive terminal and the second conductive terminal also serves as a reference terminal that provides a reference voltage of the control terminal. The description below will be given of an example in which the power switching element P is a MOSFET, the control terminal is a gate terminal, the first conductive terminal is a source terminal, the second conductive terminal is a drain terminal, and the source terminal is a reference terminal. A voltage applied between the gate terminal and the source terminal may also be referred to as a "gate voltage". A voltage applied between the drain terminal and the source terminal may also be referred to as a "drain voltage". However, the power switching element P is not limited to this configuration, and another configuration can also be explained by appropriately replacing the components on the basis of the above description.

The gate driving apparatus 100 includes a gate driver 10 and a control circuit 20. The gate driver 10 and the control circuit 20 may be mounted on the same substrate or may be mounted on different substrates. The gate driver 10 has a power source E1, a resonance circuit unit 11, and a clamp unit 12. The resonance circuit unit 11 has a coil L1 and a recovery unit. The recovery unit includes a first recovery switch SW1, a second recovery switch SW2, a first recovery diode D1, and a second recovery diode D2. The clamp unit 12 includes a first clamp switch SW3 and a second clamp switch SW4.

An input-side terminal of the coil L1 in the resonance circuit unit 11 is connectable to a first reference potential line of the power source E1 via the first recovery switch SW1. The first reference potential line applies a first reference potential Vcc. The input-side terminal of the coil L1 in the resonance circuit unit 11 is also connectable to a second reference potential line of the power source E1 via the second recovery switch SW2. The second reference potential line applies a second reference potential Vss. The first reference potential Vcc is higher than the second reference potential Vss. An output-side terminal of the coil L1 is connected in series with the gate terminal, which is the control terminal, of the power switching element P. The second reference potential Vss of the power source E1 and a source potential of the power switching element P are equal to each other. Thus, the coil L1 and the capacitor C1 constitute an LC series resonance circuit.

The first reference potential Vcc is one example of a first potential, and the second reference potential Vss is one example of a second potential. The first reference potential line is one example of a first potential line, and the second reference potential line is one example of a second potential line. In the present disclosure, the first potential line may be any current path having the first potential and does not necessarily have to be a wire. Similarly, the second potential line may be any current path having the second potential and does not necessarily have to be a wire. One example of a non-wire current path is a current path formed by inter-connecting terminals of circuit elements.

In the present disclosure, a first recovery switch may be referred to as a "charging switch", and a second recovery switch may be referred to as a "discharging switch". In the present disclosure, in a case other than modified example 6 (described below) of the first embodiment, a first recovery diode may be referred to as a "discharging diode", and a second recovery diode may be referred to as a "charging diode". In the present disclosure, an input-side terminal of a coil may be referred to as a "first terminal", and an output-side terminal thereof may be referred to as a "second terminal".

The power source E1 supplies the first reference potential Vcc or the second reference potential Vss to the gate terminal of the power switching element P. For example, when the power switching element P is in a turned ON state, the power source E1 fixes a gate potential thereof to the same potential as that of the first reference potential Vcc, and when the power switching element P is in a turned OFF state, the power source E1 fixes the gate potential thereof to the same potential as that of the second reference potential Vss. In other words, in a stable state after the power switching element P has been switched, the power source E1 applies a fixed voltage between the gate terminal and the source terminal of the power switching element P.

In the example illustrated in FIG. 1, the source terminal of the power switching element P has the same potential as the second reference potential Vss. Thus, when the gate potential of the power switching element P is fixed to the first reference potential Vcc, the voltage of the gate terminal, whose reference is the source terminal of the power switching element P, is equal to Vcc-Vss, that is, the voltage of the power source E1. When the gate potential of the power switching element P is fixed to the second reference potential Vss, the voltage of the gate terminal, whose reference is the source terminal of the power switching element P, is 0 V. In the present disclosure, "A and B are at the same potential", "A has the same potential as B" or "the potential of A reaches the potential of B" includes a case in which a small potential difference resulting from, for example, a wiring resistance, the on-resistance of a transistor, and a parasitic resistance of an electrical element occurs between the potential of A and the potential of B. The power source E1 may also be provided external to the gate driving apparatus 100.

The first recovery switch SW1 is provided between the first reference potential line and the input-side terminal of the coil L1. The second recovery switch SW2 is provided between the second reference potential line and the input-side terminal of the coil L1. FIG. 1 illustrates an example in which the first recovery switch SW1 is a p-channel MOSFET and the second recovery switch SW2 is an n-channel MOSFET. The p-channel MOSFET has a parasitic diode in which the direction from the drain to the source thereof is a forward direction. The re-channel MOSFET has a parasitic diode in which the direction from the source to the drain thereof is a forward direction. The first recovery switch SW1 and the second recovery switch SW2 may be, for example, other switching elements, such as bipolar transistors or relays.

The first recovery diode D1 is provided in a reverse direction between the first reference potential line and the input-side terminal of the coil L1. The term "reverse direction" refers to, in a state in which current flows from the first reference potential line toward the second reference potential line, a direction in which a cathode terminal of the diode is connected to a higher potential node and an anode terminal of the diode is connected to a lower potential node. That is, the first recovery diode D1 is connected in reverse direction between the first reference potential line and the input-side terminal of the coil L1. The second recovery diode D2 is connected in a reverse direction between the input-side terminal of the coil L1 and the second reference potential line. That is, the second recovery diode D2 is connected in reverse direction between the input-side terminal of the coil L1 and the second reference potential line. In the figures, of two nodes to which the diode is connected, the cathode terminal is connected to the upper node, and the anode terminal is connected to the lower node. When regenerative current or circulating current occurs, current may flow from the second reference potential line toward the first reference potential line. In this case, the first recovery diode D1 and the second recovery diode D2, which are provided in the reverse direction, are electrically connected. The cathode terminal of the first recovery diode D1 is connected to the first reference potential line, and the anode terminal of the second recovery diode D2 is connected to the second reference potential line. The first recovery diode D1 and the second recovery diode D2 may be, for example, Schottky barrier diodes.

The first clamp switch SW3 is provided between the first reference potential line and the output-side terminal of the coil L1. The second clamp switch SW4 is provided between the second reference potential line and the output-side terminal of the coil L1. FIG. 1 illustrates an example in which the first clamp switch SW3 is a p-channel MOSFET and the second clamp switch SW4 is an n-channel MOSFET.

A first reverse-flow blocking diode D3 is interposed in a forward direction between the first clamp switch SW3 and the output-side terminal of the coil L1. The term "forward direction" refers to, in a state in which current flows from the first reference potential line toward the second reference potential line, a direction in which the anode terminal of the diode is connected to a higher potential node and the cathode terminal of the diode is connected to a lower potential node. In the figures, the forward direction is a direction in which, of two nodes to which the diode is connected, the anode terminal is connected to the upper node and the cathode terminal is connected to the lower node. That is, the first reverse-flow blocking diode D3 is connected in forward direction between the first clamp switch SW3 and the output-side terminal of the coil L1. A second reverse-flow blocking diode D4 is interposed in a forward direction between the output-side terminal of the coil L1 and the second clamp switch SW4. That is, the second reverse-flow blocking diode D4 is connected in forward direction between the output-side terminal of the coil L1 and the second clamp switch SW4.

The gate driver 10 has a bridge circuit including the coil L1, four switches SW1 to SW4, and four diodes D1 to D4. Upon being put into a turned ON state, the first clamp switch SW3 causes the gate potential of the power switching element P to be clamped to the first reference potential Vcc. When the gate potential of the power switching element P is lower than the first reference potential Vcc, current is supplied from the first reference potential line to the gate terminal of the power switching element P via the first clamp switch SW3.

In such a manner, clamp current flows through a current path from the first reference potential line toward the output-side terminal of the coil L1. Since the output-side terminal of the coil L1 is connected to the gate terminal of the power switching element P to be driven, the output-side terminal of the coil L1 may be an output terminal of the gate driving apparatus 100. The first reverse-flow blocking diode D3 is provided on a current path between the first reference potential line and the output-side terminal of the coil L1. Thus, even when the first clamp switch SW3 is in the turned ON state or turned OFF state, no current flows from the output-side terminal of the coil L1 toward the first reference potential line.

In a gate driving apparatus having no first reverse-flow blocking diode D3, current can flow from the output-side terminal of the coil L1 toward the first reference potential line via a parasitic diode of the first clamp switch SW3. On the other hand, in the gate driving apparatus 100 having the first reverse-flow blocking diode D3, when the first clamp switch SW3 is in the turned ON state, current flows from the first reference potential line toward the output-side terminal of the coil L1, and when the first clamp switch SW3 is in the turned OFF state, no current flows in either of the directions between the first reference potential line and the output-side terminal of the coil L1.

Upon being put into a turned ON state, the second clamp switch SW4 causes the gate potential of the power switching element P to be clamped to the second reference potential Vss. When the gate potential of the power switching element P is higher than the second reference potential Vss, electric charge is pulled out from the gate terminal of the power switching element P to the second reference potential line via the second clamp switch SW4.

In such a manner, clamp current flows through a current path from the second reference potential line toward the output-side terminal of the coil L1. The second reverse-flow blocking diode D4 is provided on a current path between the second reference potential line and the output-side terminal of the coil L1. Thus, even when the second clamp switch SW4 is in the turned ON state or turned OFF state, current flows from the second reference potential line toward the output-side terminal of the coil L1.

In a gate driving apparatus having no second reverse-flow blocking diode D4, current can flow from the second reference potential line toward the output-side terminal of the coil L1 via a parasitic diode of the second clamp switch SW4. On the other hand, in the gate driving apparatus 100 having the second reverse-flow blocking diode D4, when the second clamp switch SW4 is in the turned ON state, current flows from the output-side terminal of the coil L1 toward the second reference potential line, and when the second clamp switch SW4 is in the turned OFF state, no current flows in either of the directions between the second reference potential line and the output-side terminal of the coil L1.

The control circuit 20 controls the first recovery switch SW1, the second recovery switch SW2, the first clamp switch SW3, and the second clamp switch SW4. Specifically, the control circuit 20 inputs pulse signals to control terminals of the switches SW1 to SW4 to thereby control the turned-ON/turned-OFF states of the switches SW1 to SW4. When the first recovery switch SW1, the second recovery switch SW2, the first clamp switch SW3, and the second clamp switch SW4 are MOSFETs, the control terminals thereof are the gate terminals.

In the first embodiment, the control circuit 20 controls the gate driver 10 by using a precharge system.

A description will be given of a case in which the power switching element P is turned on. The control circuit 20 performs control so that the first recovery switch SW1 and the second clamp switch SW4 are on and the second recovery switch SW2 and the first clamp switch SW3 are off, to thereby precharge the coil L1 with energy. The first recovery switch SW1 and the second clamp switch SW4 may be simultaneously turned on, or the first recovery switch SW1 may be turned on after the second clamp switch SW4 is turned on.

In the present disclosure, the term "precharging" means that energy is stored in a coil before current flows from a gate driving apparatus to the control terminal of a switching element or before current flows from the control terminal of a switching element to a gate driving apparatus. Also, in the present disclosure, the expression "switch A and switch B are turned on" includes a case in which switch A and switch B are simultaneously turned on, a case in which switch B is turned on after switch A is turned on, and a case in which switch A is turned on after switch B is turned on. The same also applies to the expression "switch A and switch B are turned off".

After the precharging, the control circuit 20 turns off the first recovery switch SW1 and the second clamp switch SW4. As a result, the capacitor C1, the coil L1, and the second recovery diode D2 form a closed loop passing therethrough, so that the energy stored in the coil L1 charges the capacitor C1. The first recovery switch SW1 and the second clamp switch SW4 may be simultaneously turned off, or the first recovery switch SW1 may be turned off after the second clamp switch SW4 is turned off.

A description will be given of a case in which the power switching element P is turned off. The control circuit 20 performs control so that the second recovery switch SW2 and the first clamp switch SW3 are on and the first recovery switch SW1 and the second clamp switch SW4 are off, to thereby precharge the coil L1 with energy. The second recovery switch SW2 and the first clamp switch SW3 may be simultaneously turned on, or the second recovery switch SW2 may be turned on after the first clamp switch SW3 is turned on.

After the precharging, the control circuit 20 turns off the second recovery switch SW2 and the first clamp switch SW3. As a result, energies stored in the coil L1 and the capacitor C1 are regenerated in the power source E1 via the first recovery diode D1. The second recovery switch SW2 and the first clamp switch SW3 may be simultaneously turned off, or the second recovery switch SW2 may be turned off after the first clamp switch SW3 is turned off.

[Control Method 1]

The description below will be given of one example of control method 1 according to the first embodiment.

Figure 2:
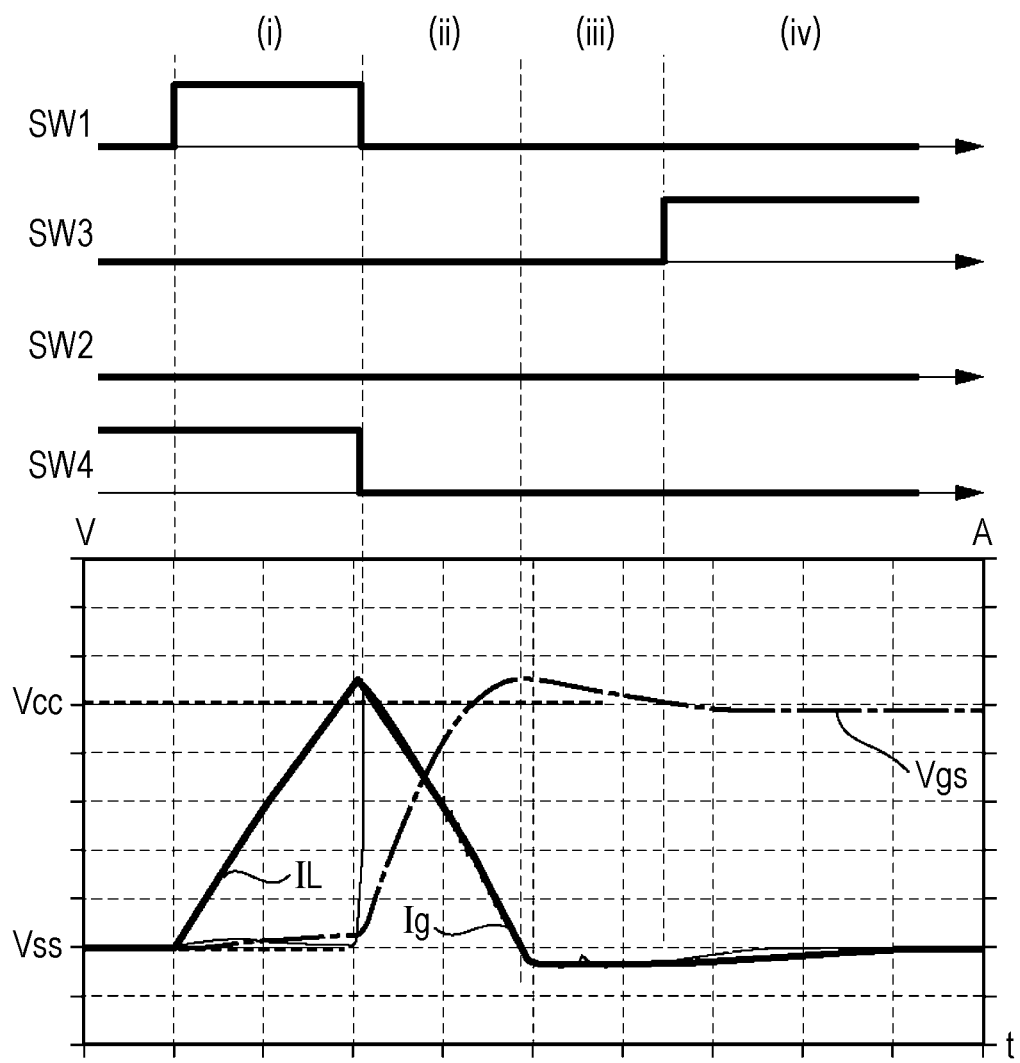
FIG. 2 illustrates a timing chart of control signals and a result of simulation in control method 1 according to the first embodiment.

FIG. 2 illustrates the temporal waveforms of control signals input to the respective switches SW1 to SW4 and one example of a simulation result of a gate voltage Vgs, a coil current IL, and a gate current Ig when the power switching element P was turned on. The gate voltage Vgs is a voltage applied between the gate terminal and the source terminal of the power switching element P. The coil current IL is current flowing in the coil L1. The gate current Ig is current flowing from the gate driver 10 to the gate terminal of the power switching element P. The gate voltage Vgs is the voltage of the gate terminal when the source terminal is assumed to be a reference. The positive direction of the gate current Ig is a direction in which it flows from the gate driver 10 to the gate terminal of the power switching element P.

An experiment was performed based on the following premise. A power switching element P to be driven was a power module having a 100 A class drain current Id. The first reference potential Vcc was set to 20 V, and the second reference potential Vss was set to −5 V. The inductance value of the coil L1 was set to hundreds of nanohenries, the resistance value of the gate resistance was set to several ohms, and the capacitance value of the capacitor C1 was set to tens of nanofarads. The first reference potential Vcc was set to 25 V, and the second reference potential Vss was set to 0 V. The inductance value of the coil L1 was to 40 to 500 nH, and the capacitance value of the capacitor C1 was set to 10 to 35 nF. The description below is based on the premise that the power switching element P is turned on when the gate voltage Vgs rises from a low level to a high level and is turned off when the gate voltage Vgs falls from the high level to the low level. In the example described below, when the power switching element P is turned on, the gate potential changes from the second reference potential Vss to the first reference potential Vcc. Also, when the power switching element P is turned off, the gate potential changes from the first reference potential Vcc to the second reference potential Vss.

Figure 3B:
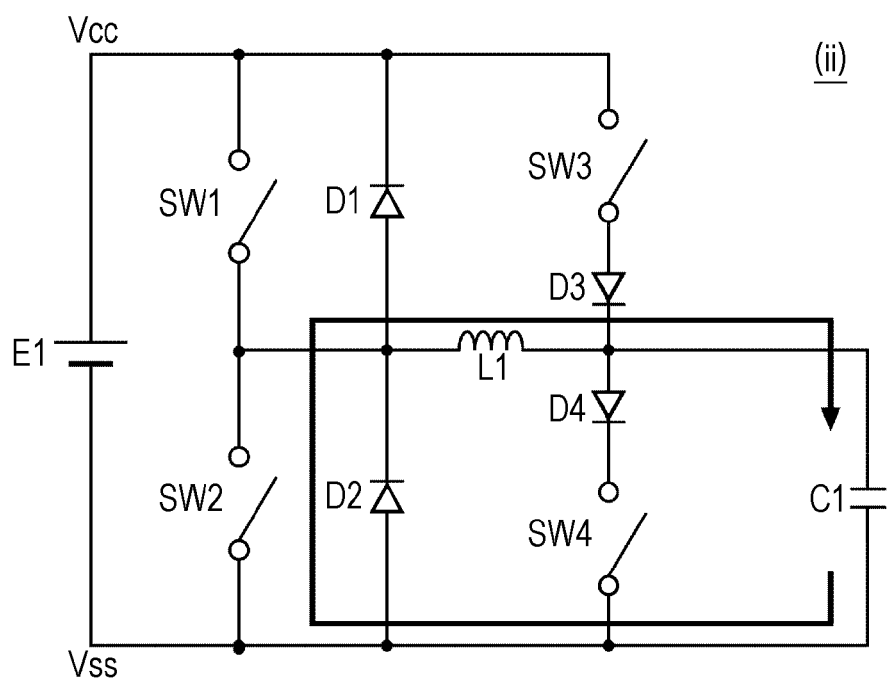
Figure 4A:
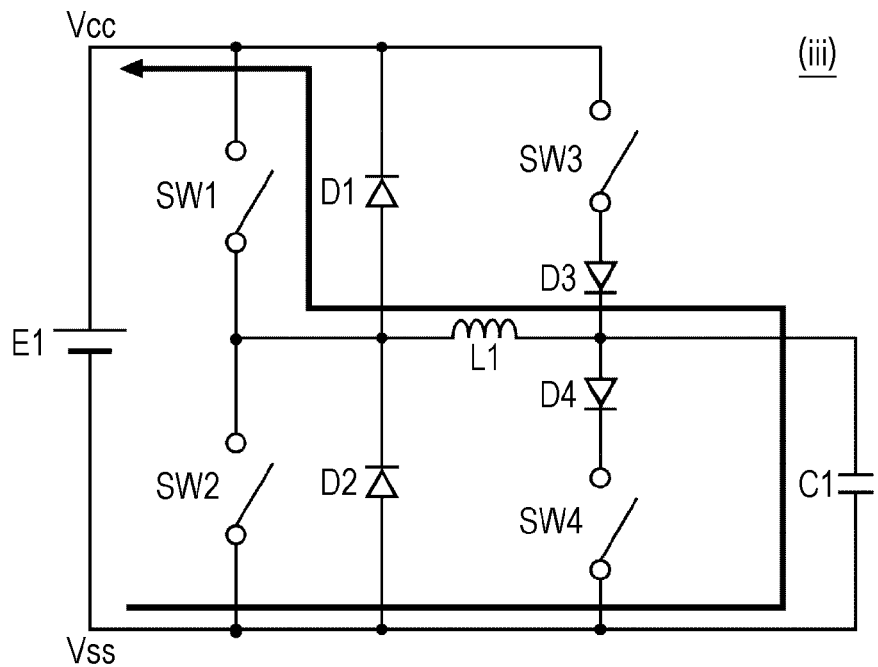
FIGS. 4A and 4B illustrate current paths in control method 1 illustrated in FIG. 2.
Figure 4B:
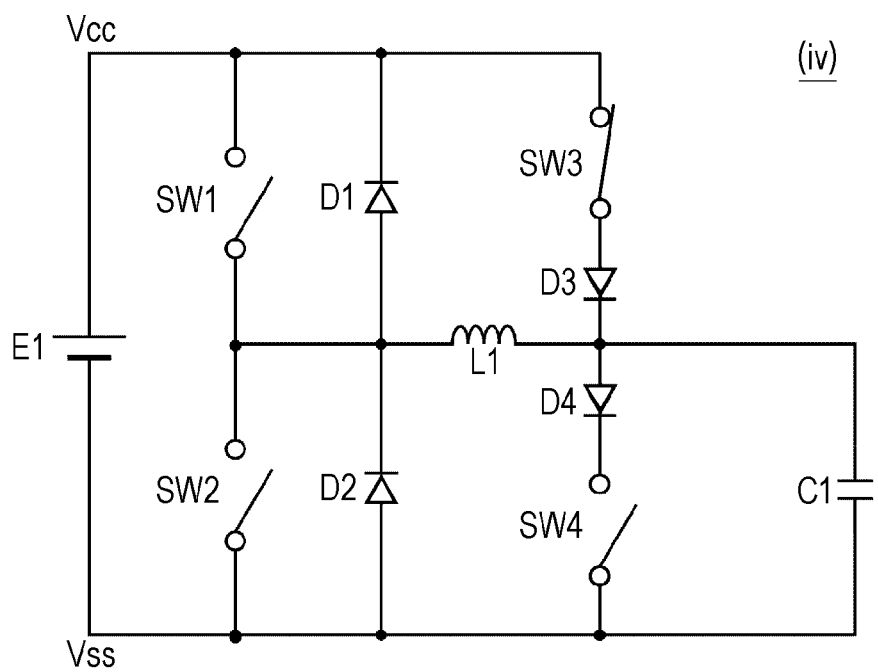

FIGS. 3A and 3B illustrate the paths of currents that flow through the gate driver 10 and the input capacitor of the power switching element P in state 1 (i) and state 2 (ii), respectively, illustrated in FIG. 2. FIGS. 4A and 4B illustrate the paths of currents that flow through the gate driver 10 and the input capacitor of the power switching element P in state 3 (iii) and state 4 (iv), respectively, illustrated in FIG. 2. In FIGS. 3A to 4B, the switches SW1 to SW4 are depicted by the signs of switches, not the signs of MOSFETs, for ease of understanding the circuit configuration.

A description will be given of an example in which the power switching element P is turned on in an initial state when the second clamp switch SW4 is on, and the first recovery switch SW1, the second recovery switch SW2, and the first clamp switch SW3 are off.

First, the control circuit 20 turns on the first recovery switch SW1 to thereby bring about state 1 (i) in which the first recovery switch SW1 and the second clamp switch SW4 are on and the second recovery switch SW2 and the first clamp switch SW3 are off. As illustrated in FIG. 3A, in state 1 (i), before the gate current Ig in the positive direction flows to the gate terminal, the power source E1 supplies current through a path from the first reference potential line toward the second reference potential line via the first recovery switch SW1, the coil L1, and the second clamp switch SW4. With this current, the coil L1 is precharged with energy. As illustrated in FIG. 2, in state 1 (i), the coil current IL increased, but the gate current Ig did not increase. The coil L1 is precharged with energy that is sufficient to cause the gate potential to reach the first reference potential Vcc.

Next, after a preset precharge period passes, the control circuit 20 turns off the first recovery switch SW1 and the second clamp switch SW4 to thereby bring about state 2 (ii) in which the first recovery switch SW1, the first clamp switch SW3, the second recovery switch SW2, and the second clamp switch SW4 are off. As illustrated in FIG. 3B, in state 2 (ii), when a closed loop including the coil L1, the capacitor C1, and the second recovery diode D2 is formed, the energy precharged in the coil L1 causes current to flow through the closed loop, and this current charges the capacitor C1. That is, resonance current flows from the coil L1 toward the capacitor C1. When the energy precharged in the coil L1 is exhausted and the gate potential becomes higher than the first reference potential Vcc, current in a negative direction occurs, as illustrated in FIG. 4A. As illustrated in FIG. 4A, in state 3 (iii), current is regenerated through a path from the capacitor C1 toward the power source E1 via the coil L1 and the first recovery diode D1.

Next, when a preset period has passed after the first recovery switch SW1 and the second clamp switch SW4 were turned off, the control circuit 20 turns on the first clamp switch SW3 to thereby bring about state 4 (iv) in which the first clamp switch SW3 is on, and the first recovery switch SW1, the second recovery switch SW2, and the second clamp switch SW4 are off. In state 4 (iv), the first reference potential line and the output-side terminal of the coil L1 are electrically connected via the first clamp switch SW3 and the first reverse-flow blocking diode D3. When the gate potential has already reached the first reference potential Vcc, almost no clamp current flows, as illustrated in FIG. 4B, and the gate potential is fixed to the first reference potential Vcc. If the gate potential has not reached the first reference potential Vcc at the point when the first clamp switch SW3 is turned on, clamp current flows from the first reference potential line to the gate terminal of the power switching element P via the first clamp switch SW3 and the first reverse-flow blocking diode D3 after the first clamp switch SW3 is turned on.

Figure 5:
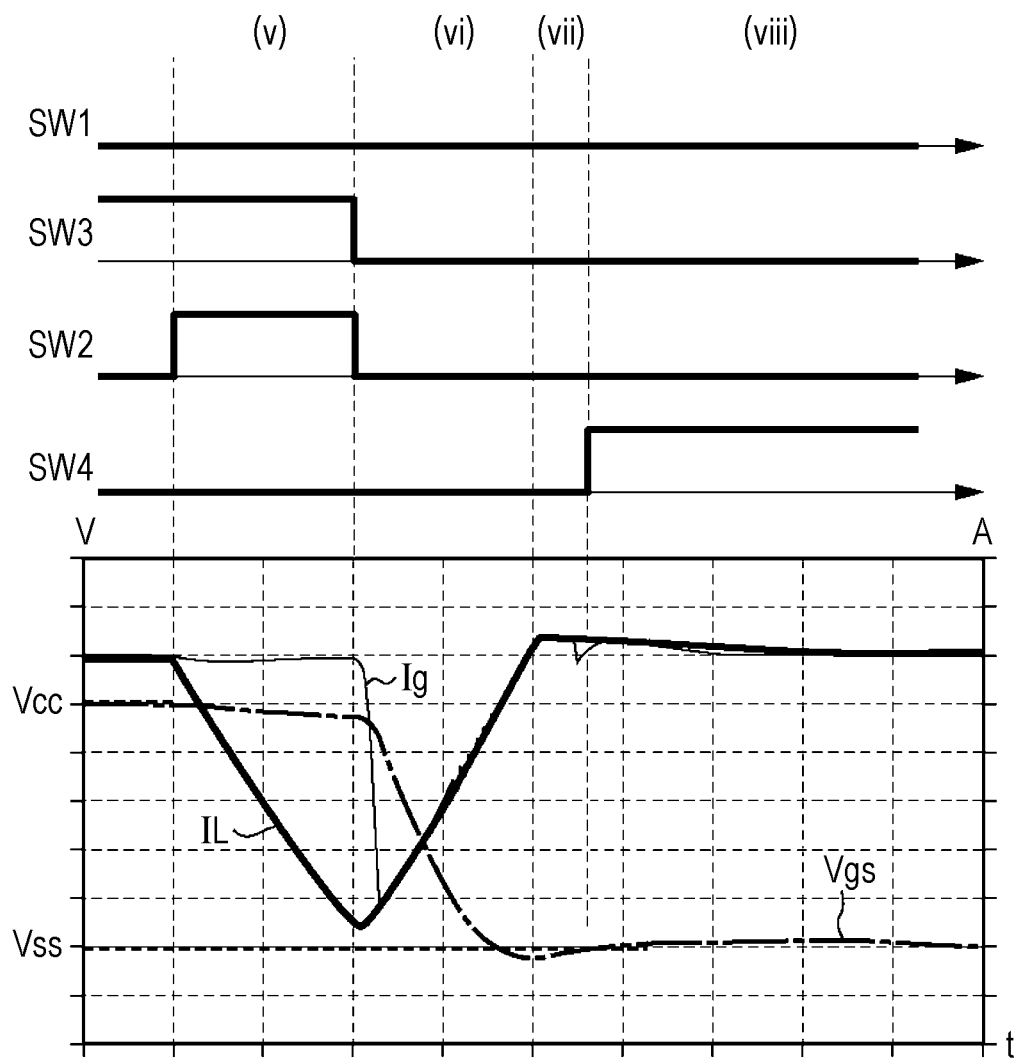
FIG. 5 illustrates a timing chart of control signals and a result of simulation in control method 1 according to the first embodiment.

FIG. 5 illustrates the temporal waveforms of control signals input to the respective switches SW1 to SW4 and one example of a simulation result of the gate voltage Vgs, the coil current IL, and the gate current Ig when the power switching element P was turned off. The gate voltage Vgs is the voltage of the gate terminal when the source terminal is assumed to be a reference. The positive direction of the gate current Ig is a direction in which it flows from the gate driver 10 to the gate terminal of the power switching element P. The premise of this experiment was analogous to that in the simulation illustrated in FIG. 2.

Figure 6A:
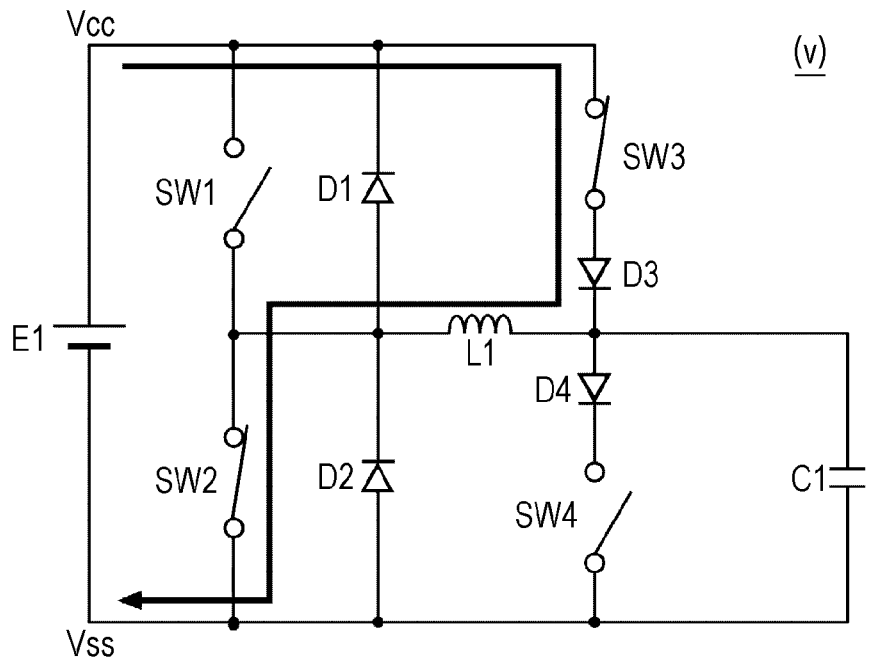
FIGS. 6A and 6B illustrate current paths in control method 1 illustrated in FIG. 5.
Figure 6B:
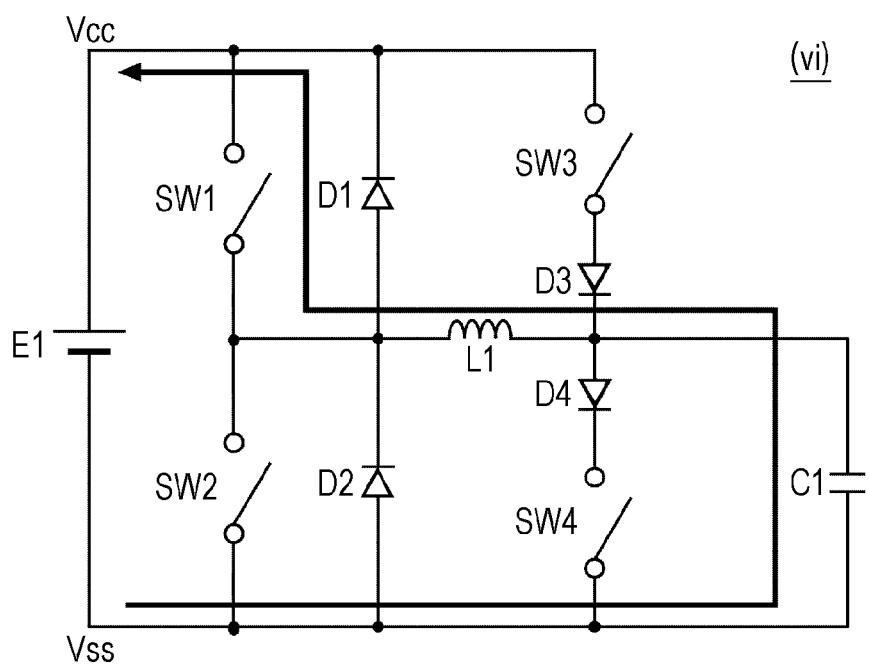
Figure 7A:
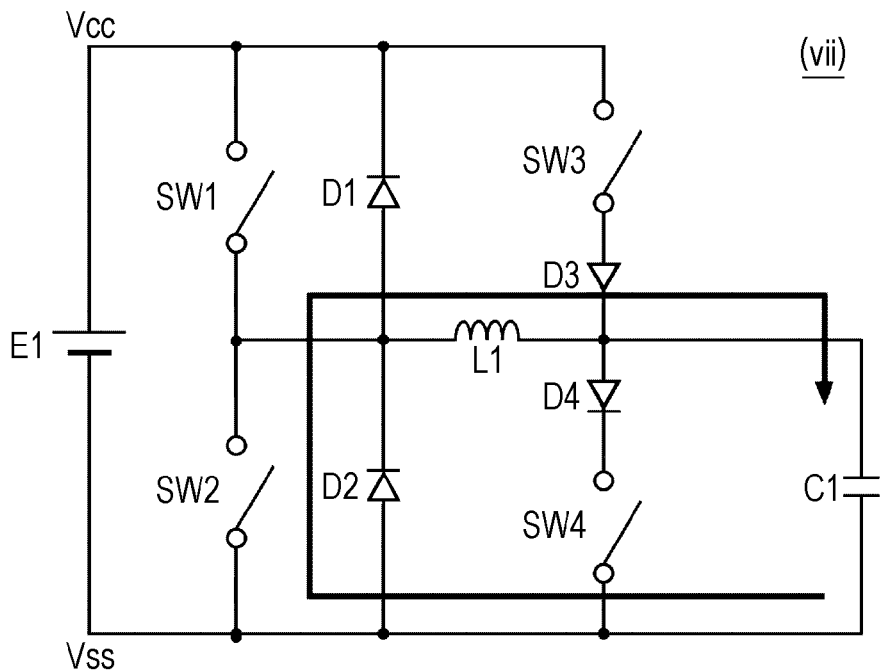
FIGS. 7A and 7B illustrate current paths in control method 1 illustrated in FIG. 5.
Figure 7B:
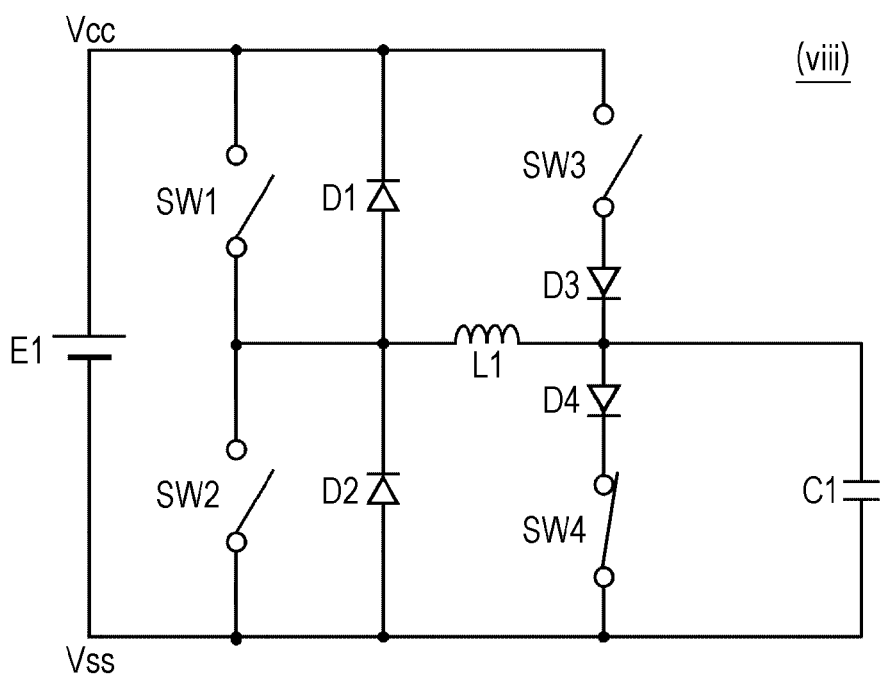

FIGS. 6A and 6B illustrate the paths of currents that flow through the gate driver 10 and the input capacitor of the power switching element P in state 5 (v) and state 6 (vi), respectively, illustrated in FIG. 5. FIGS. 7A and 7B illustrate the paths of currents that flow through the gate driver 10 and the input capacitor of the power switching element P in state 7 (vii) and state 8 (viii), respectively, illustrated in FIG. 5. In FIGS. 6A to 7B, the switches SW1 to SW4 are depicted by the signs of switches, not the signs of MOSFETs, for ease of understanding the circuit configuration.

A description will be given of an example in which the power switching element P is turned off in an initial state when the first clamp switch SW3 is on, and the first recovery switch SW1, the second recovery switch SW2, and the second clamp switch SW4 are off.

First, the control circuit 20 turns on the second recovery switch SW2 to thereby bring about state 5 (v) in which the second recovery switch SW2 and the first clamp switch SW3 are on and the first recovery switch SW1 and the second clamp switch SW4 are off. As illustrated in FIG. 6A, in state 5 (v), before the gate current Ig in a negative direction flows from the gate terminal, the power source E1 supplies current through a path from the first reference potential line to the second reference potential line via the first clamp switch SW3, the coil L1, and the second recovery switch SW2. With this current, the coil L1 is precharged with energy. As illustrated in FIG. 5, in state 5 (v), the coil current IL increased in a negative direction, but the gate current Ig did not increase. The coil L1 is precharged with energy that is sufficient to cause the gate potential to reach the second reference potential Vss.

Next, after a preset precharge period passes, the control circuit 20 turns off the second recovery switch SW2 and the first clamp switch SW3 to thereby bring about state 6 (vi) in which the first recovery switch SW1, the first clamp switch SW3, the second recovery switch SW2, and the second clamp switch SW4 are off. As illustrated in FIG. 6B, in state 6 (vi), energies, that are stored in the coil L1 and the capacitor C1, are regenerated in the power source E1 via the first recovery diode D1. Since the coil L1 has been precharged with energy, current that rises steeply flows in a negative direction from the capacitor C1 toward the power source E1. When the energy precharged in the coil L1 is exhausted and the gate potential becomes lower than the second reference potential Vss, current flows in the positive direction, as illustrated in FIG. 7A. As illustrated in FIG. 7A, in state 7 (vii), a closed loop including the coil L1, the capacitor C1, and the second recovery diode D2 is formed, so that current flows therethrough from the coil L1 to the capacitor C1.

Next, when a preset period has passed after the second recovery switch SW2 and the first clamp switch SW3 were turned off, the control circuit 20 turns on the second clamp switch SW4 to thereby bring about state 8 (viii) in which the second clamp switch SW4 is on, and the first recovery switch SW1, the second recovery switch SW2, and the first clamp switch SW3 are off. In state 8 (viii), the second reference potential line and the output-side terminal of the coil L1 are electrically connected via the second reverse-flow blocking diode D4 and the second clamp switch SW4. When the gate potential has already reached the second reference potential Vss, almost no clamp current flows, as illustrated in FIG. 7B, and the gate potential is fixed to the second reference potential Vss. If the gate potential has not reached the second reference potential Vss at the point when the second clamp switch SW4 is turned on, clamp current flows from the gate terminal of the power switching element P to the second reference potential line via the second reverse-flow blocking diode D4 and the second clamp switch SW4 after the second clamp switch SW4 is turned on.

[Control Method 2]

The description below will be given of one example of control method 2 according to the first embodiment.

Figure 8:
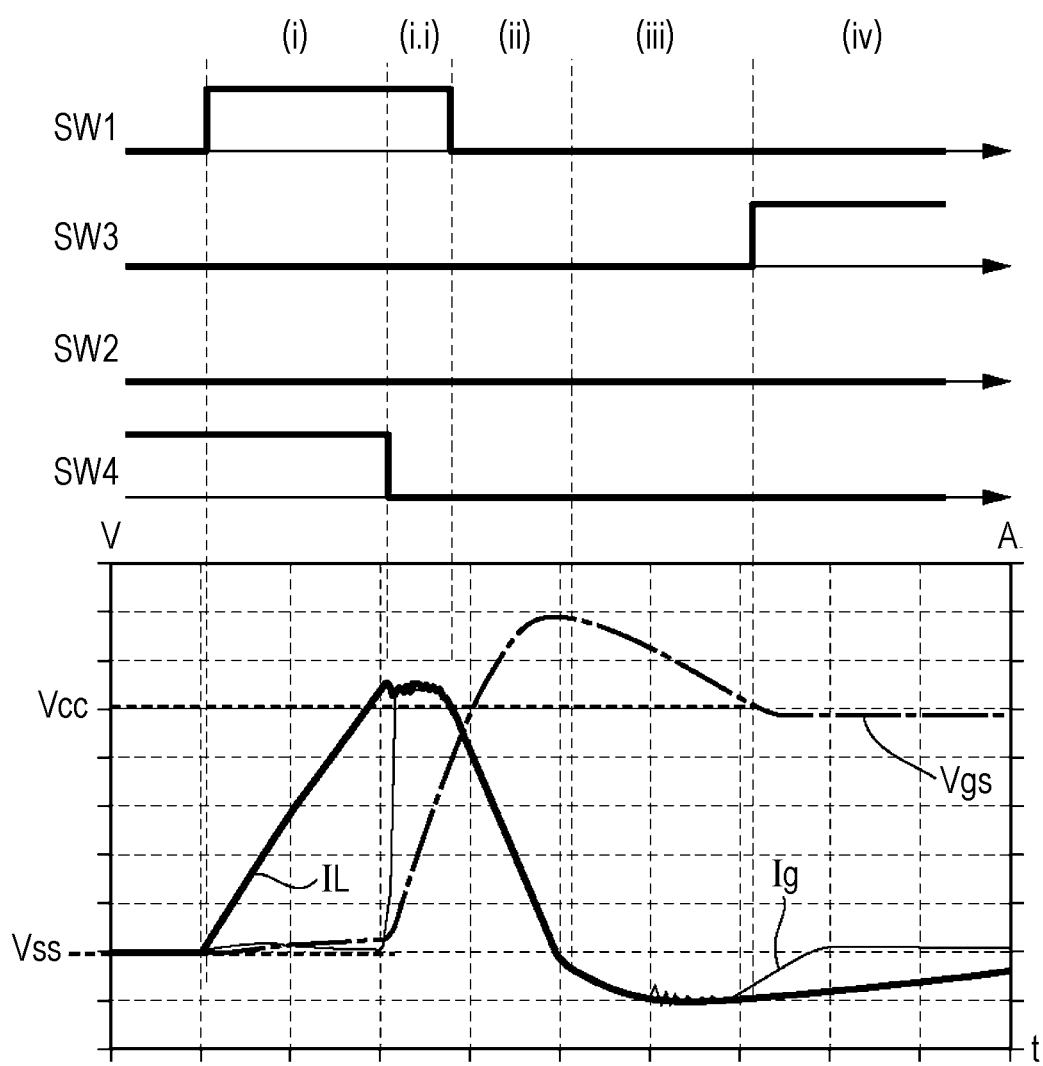
FIG. 8 illustrates a timing chart of control signals and a result of simulation in control method 2 according to the first embodiment.

FIG. 8 illustrates the temporal waveforms of control signals input to the respective switches SW1 to SW4 and one example of a simulation result of a gate voltage Vgs, a coil current IL, and a gate current Ig when the power switching element P was turned on.

FIG. 9 illustrates the temporal waveforms of control signals input to the respective switches SW1 to SW4 and one example of a simulation result of the gate voltage Vgs, the coil current IL, and the gate current Ig when the power switching element P is turned off. The gate voltage Vgs is a voltage applied between the gate terminal and the source terminal of the power switching element P. The coil current IL is current flowing in the coil L1. The gate current Ig is current flowing from the gate driver 10 to the gate terminal of the power switching element P. The gate voltage Vgs is the voltage of the gate terminal when the source terminal is assumed to be a reference. The positive direction of the gate current Ig is a direction in which it flows from the gate driver 10 to the gate terminal of the power switching element P.

Figure 10A:
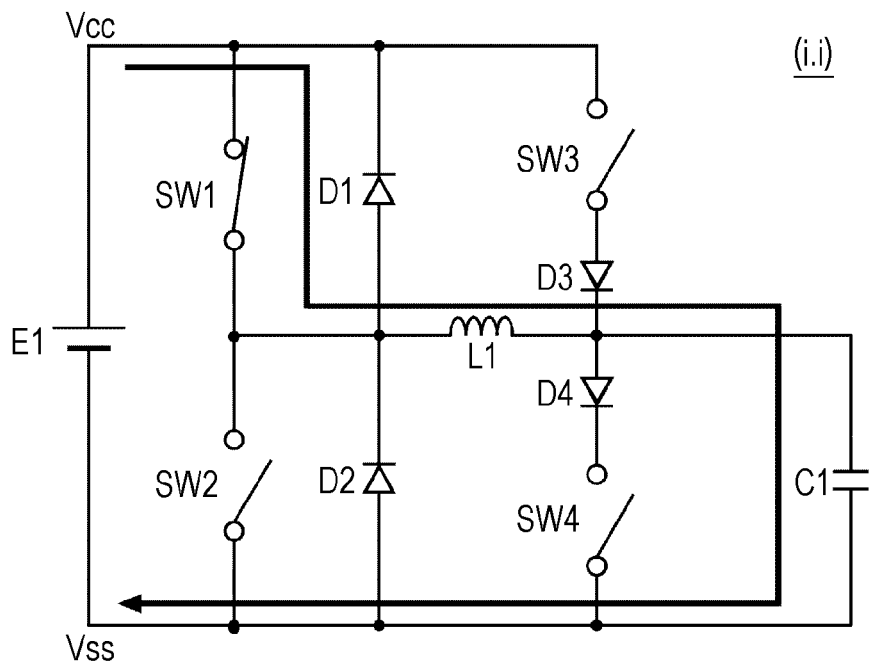
FIGS. 10A and 10B illustrate current paths in control method 2 illustrated in FIGS. 8 and 9.
Figure 10B:
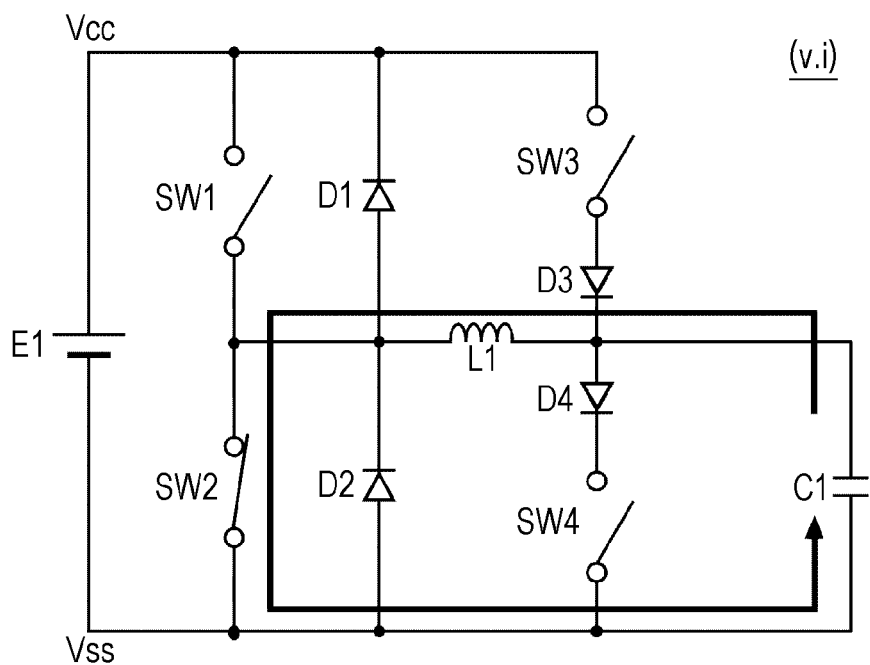

When the control signals according to control method 2 turns on the power switching element P, the state 1.1 (i.i) is provided between state 1 (i) and state 2 (ii). When the control signals according to control method 2 turns off the power switching element P, the state 5.1 (v.i) is provided between state 5 (v) and state 6 (vi). These are the difference between control methods 1 and 2. FIG. 10A illustrates the path of current that flows through the gate driver 10 and the input capacitor of the power switching element P in state 1.1 (i.i) illustrated in FIG. 8. FIG. 10B illustrates the path of current that flows through the gate driver 10 and the input capacitor of the power switching element P in state 5.1 (v.i) illustrated in FIG. 9. The description below will be given of state 1.1 (i.i) and state 5.1 (v.i) in control method 2. Descriptions of other portions that are the same as or similar to those in control method 1 are not given hereinafter.

The control circuit 20 turns off the second clamp switch SW4 to thereby change state 1 (i) in which the first recovery switch SW1 and the second clamp switch SW4 are on and the second recovery switch SW2 and the first clamp switch SW3 are off to state 1.1 (i.i) in which the first recovery switch SW1 is on, and the first clamp switch SW3, the second recovery switch SW2, and the second clamp switch SW4 are off. As illustrated in FIG. 10A, in state 1.1 (i.i), current flows from the power source E1 to the capacitor C1 via the first recovery switch SW1 and the coil L1. With this current, energy is stored in the coil L1 and the capacitor C1 is charged. As illustrated in FIG. 8, in state 1.1 (i.i), since energy is continuously supplied from the power source E1 to the coil L1, the coil current IL is marinated at substantially the same level without decreasing.

The control circuit 20 turns off the first clamp switch SW3 to thereby change state 5 (v) in which the second recovery switch SW2 and the first clamp switch SW3 are on and the first recovery switch SW1 and the second clamp switch SW4 are off to state 5.1 (v.i) in which the second recovery switch SW2 is on, and the first recovery switch SW1, the first clamp switch SW3, and the second clamp switch SW4 are off. As illustrated in FIG. 10B, in state 5.1 (v.i), current flowing from the capacitor C1 causes energy to be stored in the coil L1. As illustrated in FIG. 9, in state 5.1 (v.i), since energy stored in the coil L1 is not regenerated in the power source E1 via the first recovery switch SW1, the coil current IL is maintained at substantially the same level without decreasing.

[Comparison Between Consideration Example and Example of Control Method 1]

Figure 11:
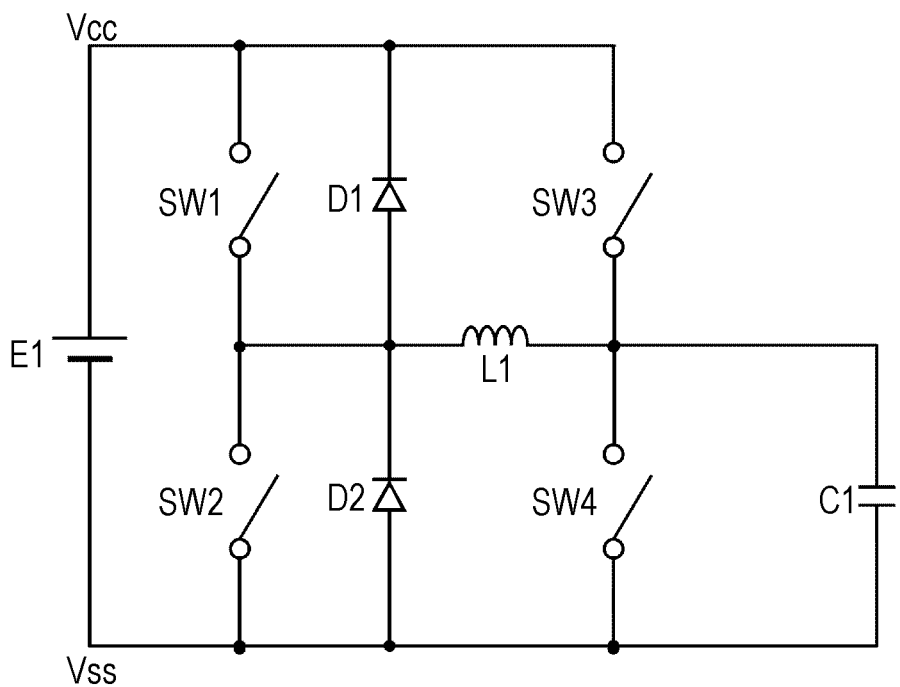
FIG. 11 illustrates the configuration of a gate driving apparatus according to consideration example.
Figure 12:
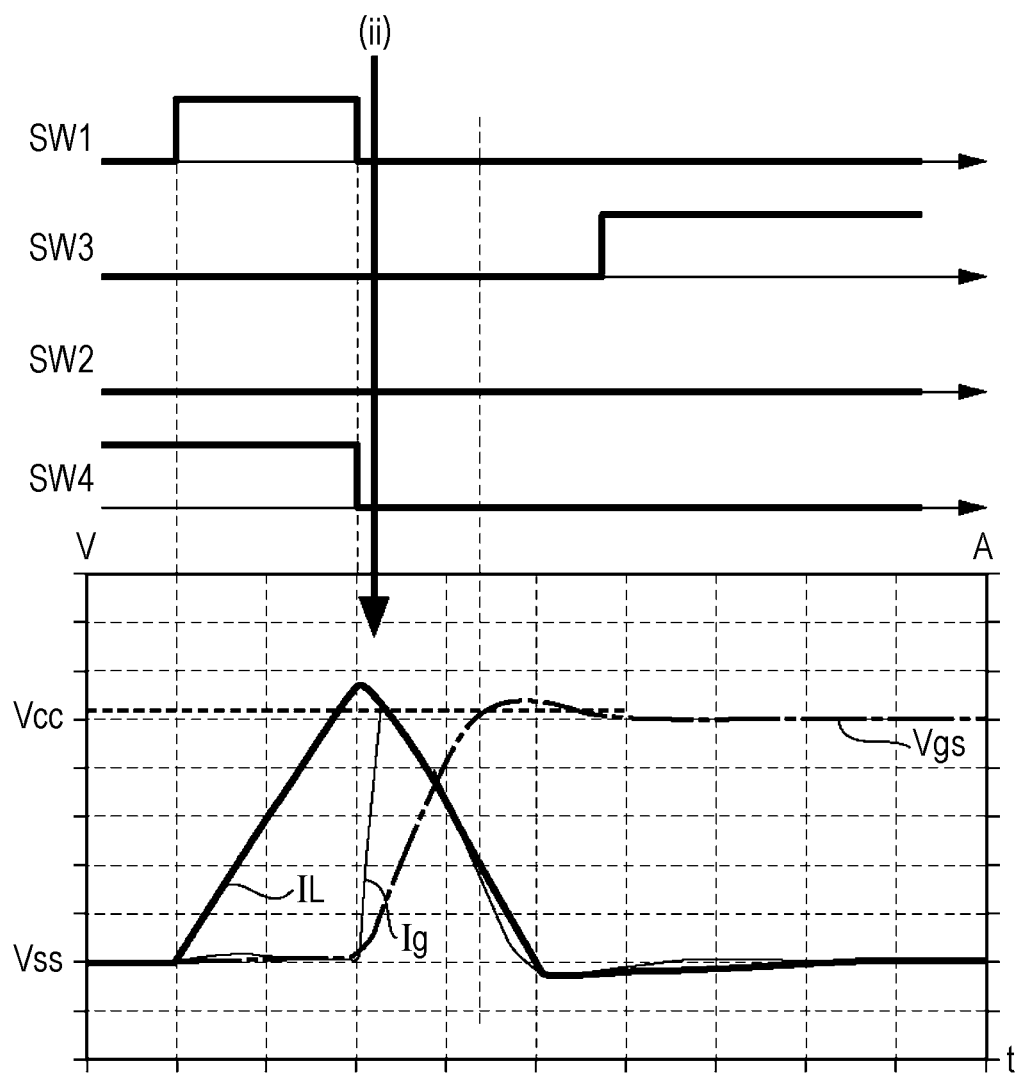
FIG. 12 illustrates a timing chart of control signals and a result of simulation according to a consideration example.
Figure 13:
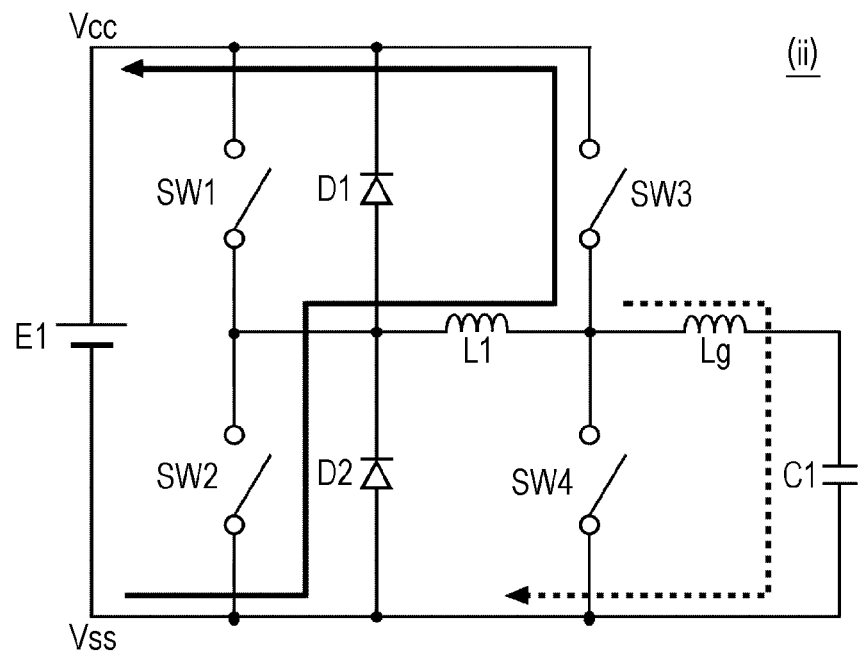
FIG. 13 illustrates a current path in a control method illustrated in FIG. 12.

FIG. 11 illustrates the configuration of the gate driver 10 according to a consideration example. The gate driver 10 according to the consideration example has a configuration in which the first reverse-flow blocking diode D3 and the second reverse-flow blocking diode D4 are omitted from the gate driver 10 illustrated in FIG. 1. FIG. 12 illustrates the temporal waveforms of control signals input to the respective switches SW1 to SW4 and an experimental result of the gate voltage Vgs, the coil current IL, and the gate current Ig when the power switching element P according to the consideration example is turned on. FIG. 13 illustrates the path of current that flows through the gate driver 10 and the input capacitor of the power switching element P in state 2 (ii) illustrated in FIG. 12.

As illustrated in FIG. 13, typically, a parasitic inductance Lg due to wiring or the like exists between the output terminal of the gate driving apparatus 100 and the gate terminal of the power switching element P. Although not illustrated in FIGS. 3A to 4B, 6A to 7B, and 10A to 12, typically, a similar parasitic inductance Lg exists. This parasitic inductance Lg affects the gate voltage Vgs. Specifically, when the coil current IL is increased in order to cause an output voltage Vo of the gate driving apparatus 100 to rise at high speed, the rise of the gate voltage Vgs is delayed by the parasitic inductance Lg. When the parasitic inductance Lg exists, the gate voltage Vgs is defined by:

$$Vgs = Vo - (Lg \cdot \Delta Ig / \Delta t) \quad (1)$$

where $\Delta Ig/\Delta t$ represents the rate of change in the gate current Ig per unit time.

Accordingly, the larger the parasitic inductance Lg is or the higher the rate of change in the gate current Ig per unit time is, the larger the difference between the output voltage Vo of the gate driving apparatus 100 and the gate voltage Vgs of the power switching element P becomes. For example, in the case when the power switching element P is turned on, the first recovery switch SW1 and the second clamp switch SW4 are turned off after the coil L1 is precharged, and thereby charging of the capacitor C1 is started, as in the example of control method 1 described above. However, there are cases in which, when the output voltage Vo of the gate driving apparatus 100 reaches the first reference potential Vcc, regenerative current is more likely to flow to the power source E1. The regenerative current flows through a path from the second reference potential line toward the first reference potential line via the second recovery diode D2, the coil L1, and the parasitic diode of the first clamp switch SW3, as illustrated in FIG. 13. In this case, since part of the coil current IL is supplied to the gate terminal, the gate current Ig is smaller than the coil current IL. That is, the coil current IL is not effectively used for the rise of the gate voltage Vgs. Consequently, the rise of the gate voltage Vgs is delayed. This regenerative current causes power loss.

In contrast, the gate driving apparatus 100 of the first embodiment has the first reverse-flow blocking diode D3 on the path between the output-side terminal of the coil L1 and the first reference potential line. Accordingly, it is possible to block regenerative current flowing from the output-side terminal of the coil L1 toward the first reference potential line, thus allowing almost all of the coil current IL to be supplied to the gate terminal. The simulation result illustrated in FIG. 2 shows that the coil current IL and the gate current Ig match each other from when the first recovery switch SW1 and the second clamp switch SW4 are turned off until the gate potential reaches the first reference potential Vcc. The simulation result illustrated in FIG. 8 also shows that the coil current IL and the gate current Ig match each other from when the first recovery switch SW1 and the second clamp switch SW4 are turned off until the gate potential reaches the first reference potential Vcc. In contrast, the simulation result according to the consideration example illustrated in FIG. 12 shows that the gate current Ig is smaller than the coil current IL.

In the examples illustrated in FIGS. 2 and 8, the absolute value of the gate current Ig exhibits its maximum peak value before the gate potential reaches the first reference potential Vcc, and becomes smaller than the maximum peak value at the point when the gate potential reaches the first reference potential Vcc. The absolute value of the gate current Ig when the gate potential reaches a fixed voltage level may be smaller than two-thirds of the maximum peak value. The absolute value of the gate current Ig when the gate potential reaches the fixed voltage level may also be smaller than a half of the maximum peak value. The absolute value of the gate current Ig when the gate potential reaches the fixed voltage level may also be substantially zero. In this case, regenerative current is completely suppressed.

In the first embodiment, the control circuit 20 controls the on/off states of the first recovery switch SW1, the second recovery switch SW2, the first clamp switch SW3, and the second clamp switch SW4. As a result of the control, the gate voltage Vgs and the gate current Ig are supplied to the gate terminal of the power switching element P. The timings at which the first recovery switch SW1, the second recovery switch SW2, the first clamp switch SW3, and the second clamp switch SW4 are turned on or off may also be determined based on theoretical values or values resulting from an experiment or simulation. Information regarding these timings may be pre-recorded in the control circuit 20. For example, the gate driving apparatus 100 may have a detecting unit for detecting the gate voltage Vgs and/or the gate current Ig. In this case, the detecting unit may feed back the detection value to the control circuit 20. Furthermore, the control circuit 20 may determine the on/off timings of the first recovery switch SW1, the second recovery switch SW2, the first clamp switch SW3, and the second clamp switch SW4, based on the detection values.

Figure 14:
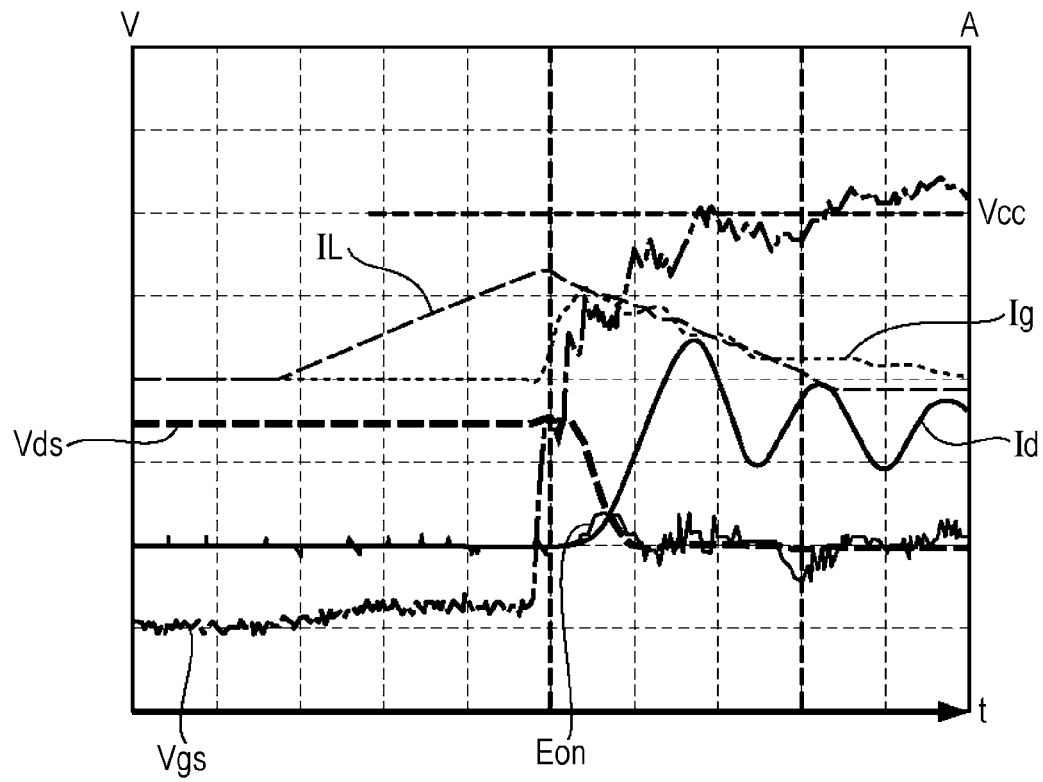
FIG. 14 is a graph illustrating an experimental result according to the consideration example.
Figure 15:
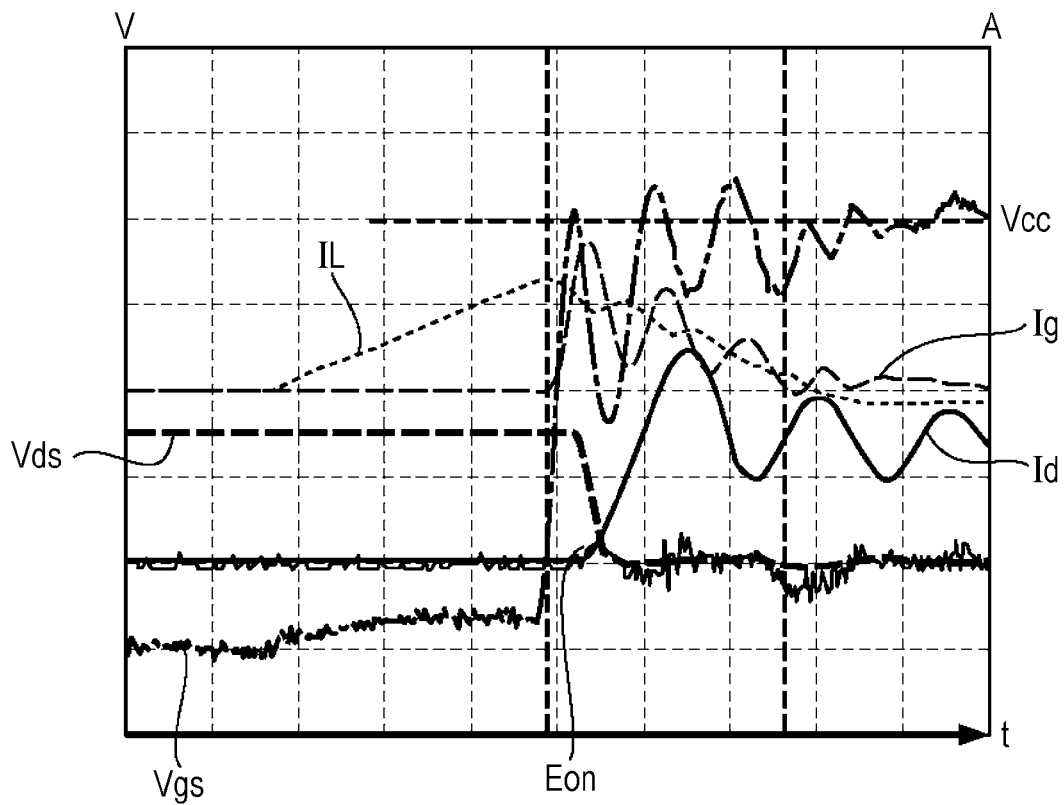
FIG. 15 is a graph illustrating an experimental result according to an Example of the first embodiment.

FIG. 14 illustrates details of an experimental result in the consideration example. FIG. 15 illustrates details of an experimental result of an Example of control method 1 according to the first embodiment. FIGS. 14 and 15 illustrate relationships of the drain voltage Vds, the drain current Id, and turn-on loss Eon, in addition to the gate voltage Vgs, the coil current IL, and the gate current Ig.

A comparison between the experimental result according to the consideration example illustrated in FIG. 14 and the experimental result according to the Example illustrated in FIG. 15 shows that the rate of change in the drain voltage per unit time, $\Delta Vds/\Delta t$, in the Example was prominently higher than that in the consideration example. The turn-on loss Eon in the Example was prominently smaller than that in the consideration example. The ringing voltage between the gate and the source in the Example was substantially the same as that in the consideration example. Driver loss Pdrv in the Example was smaller than that in the consideration example. In the Example, almost all of the coil current IL flows into the gate. In contrast, in the consideration example, part of the coil current IL becomes regenerative current and the remaining part flows into the gate. Accordingly, the rate of change in the drain voltage per unit time, $\Delta Vds/\Delta t$, in the Example is thought to be increased by an amount corresponding to the increased amount of current supplied to the gate terminal, compared with the consideration example.

[Effect]

Since the gate driving apparatus 100 according to the first embodiment has the first reverse-flow blocking diode D3 and the second reverse-flow blocking diode D4, it is possible to efficiently pass the coil current IL into the gate terminal of the power switching element P. Therefore, the gate driving apparatus 100 can enhance the switching characteristics of the power switching element P. That is, the gate driving apparatus 100 can increase the switching speed, thus making it possible to reduce switching loss. Since the gate driving apparatus 100 can suppress unwanted regenerative current and circulating current in the gate driving apparatus 100, it is possible to reduce power loss in the gate driving apparatus 100. The gate driving apparatus 100 can stabilize the waveform of the gate voltage, since no excessive energy is stored in the coil L1. Control method 2 according to the first embodiment can increase the gate current Ig, compared with control method 1. Accordingly, control method 2 according to the first embodiment can further increase the switching speed of the power switching element P.

(Various Modified Examples of First Embodiment)

The description below will be given of a modified example of the gate driving apparatus 100 according to the first embodiment. Hereinafter, descriptions and illustrations of portions that are the same as or similar to those in the gate driving apparatus 100 illustrated in FIG. 1 and the control methods illustrated in FIGS. 2, 5, 8 and 9 may be omitted. For example, FIGS. 16 to 20 and 22 to 24 illustrate only the gate driver 10 and the input capacitor C1 of the power switching element P. For example, the gate driving apparatus 100 illustrated in FIGS. 15 to 19, 22, and 23 can be operated by, for example, the control method illustrated in FIGS. 2 and 5 or FIGS. 8 and 9.

Figure 16:
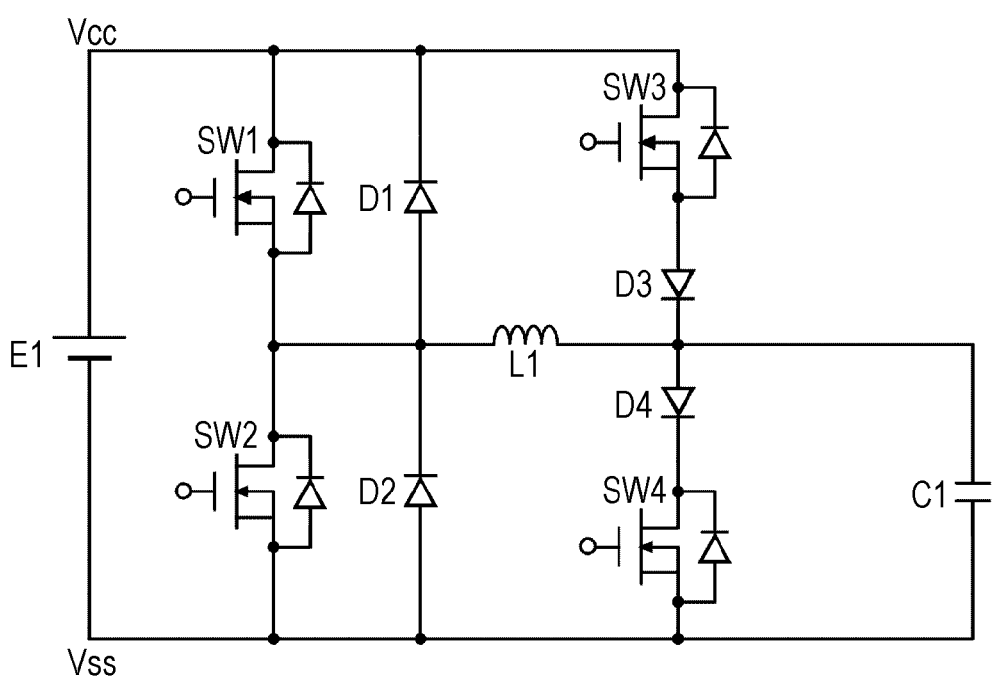
FIG. 16 illustrates the configuration of a gate driving apparatus according to modified example 1 of the first embodiment.

FIG. 16 illustrates the configuration of a gate driving apparatus 100 according to modified example 1. In the gate driving apparatus 100 according to modified example 1, the first recovery switch SW1 and the first clamp switch SW3 are re-channel MOSFETs.

Figure 17:
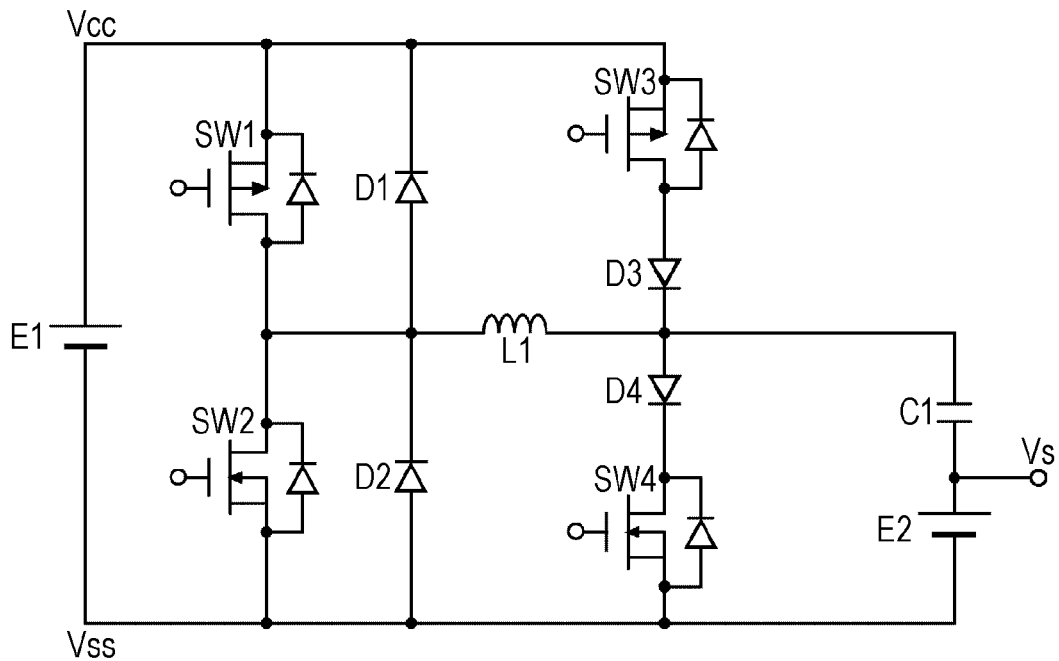
FIG. 17 illustrates the configuration of a gate driving apparatus according to modified example 2 of the first embodiment.

FIG. 17 illustrates the configuration of a gate driving apparatus 100 according to modified example 2. In the gate driving apparatus 100 according to modified example 2, the second reference potential Vss of the power source E1 is set to a negative potential. An auxiliary power source E2 is provided between the source terminal of the power switching element P and the second reference potential line. Thus, the potential of the auxiliary power source E3, not the second reference potential Vss from the second reference potential line, is supplied to the source terminal of the power switching element P. In the example illustrated in FIG. 17, the first reference potential Vcc of the power source E1 may be 20 V, the second reference potential Vss may be −5 V, and the voltage supplied by the auxiliary power source E2 may be 5 V. In this case, the gate driving apparatus 100 according to modified example 2 can apply a gate voltage of −5 V between the gate and the source of the power switching element P. For example, when the power switching element P is a normally-ON power device or a power device having a small threshold value, the gate driving apparatus 100 according to modified example 2 can apply a negative bias between the gate and the source of the power switching element P. That is, after turning off the power switching element P, the gate driving apparatus 100 according to modified example 2 can fix the voltage between the gate and the source of the power switching element P to a negative voltage.

Figure 18:
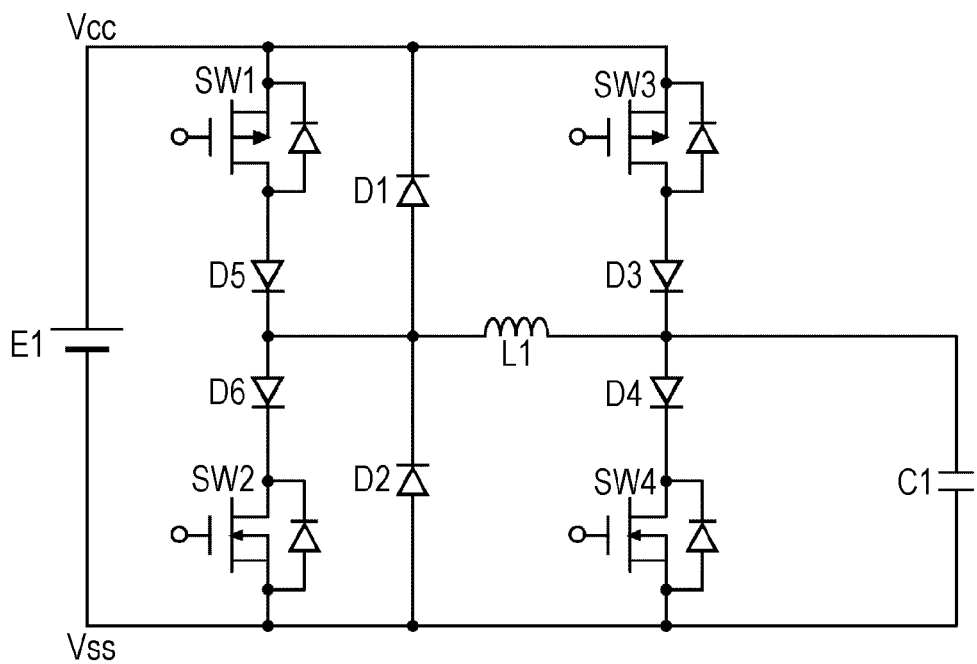
FIG. 18 illustrates the configuration of a gate driving apparatus according to modified example 3 of the first embodiment.

FIG. 18 illustrates the configuration of a gate driving apparatus 100 according to modified example 3. The gate driving apparatus 100 according to modified example 3 includes a diode D5 for reverse-flow blocking and a diode D6 for reverse-flow blocking. The diode D5 for reverse-flow blocking is provided between the first recovery switch SW1 and the input-side terminal of the coil L1, and the diode D6 for reverse-flow blocking is provided between the second recovery switch SW2 and the input-side terminal of the coil L1. The diode D5 for reverse-flow blocking can block current flowing to the body diode of the first recovery switch SW1 and can pass the current to the first recovery diode D1 exclusively. The diode D6 for reverse-flow blocking can block current flowing to the body diode of the second recovery switch SW2 and can pass the current to the second recovery diode D2 exclusively.

Figure 19:
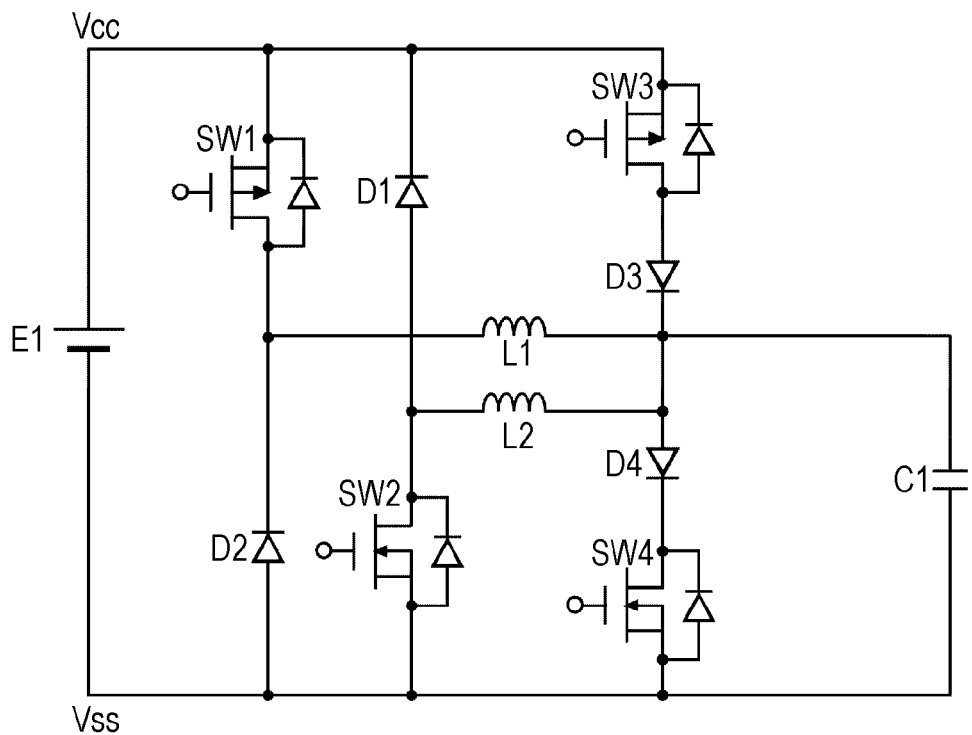
FIG. 19 illustrates the configuration of a gate driving apparatus according to modified example 4 of the first embodiment.

FIG. 19 illustrates the configuration of a gate driving apparatus 100 according to modified example 4. The gate driving apparatus 100 according to modified example 4 includes a first coil L1 and a second coil L2. Thus, the rise waveform and the fall waveform of the gate voltage Vgs can be different from each other. Specifically, the first recovery switch SW1 is connected between the input-side terminal of the first coil L1 and the first reference potential line, and the second recovery diode D2 is connected in a reverse direction between the input-side terminal of the first coil L1 and the second reference potential line. The output-side terminal of the first coil L1 is connected to the gate terminal of the power switching element P. The first recovery diode D1 is connected in a reverse direction between the input-side terminal of the second coil L2 and the first reference potential line, and the second recovery switch SW2 is connected between the input-side terminal of the second coil L2 and the second reference potential line. The output-side terminal of the second coil L2 is connected to the gate terminal of the power switching element P. In this configuration, when the inductance values of the coil L1 and the coil L2 are different from each other, the shape of the rise waveform of the gate voltage Vgs and the shape of fall waveform differ from each other.

Figure 20:
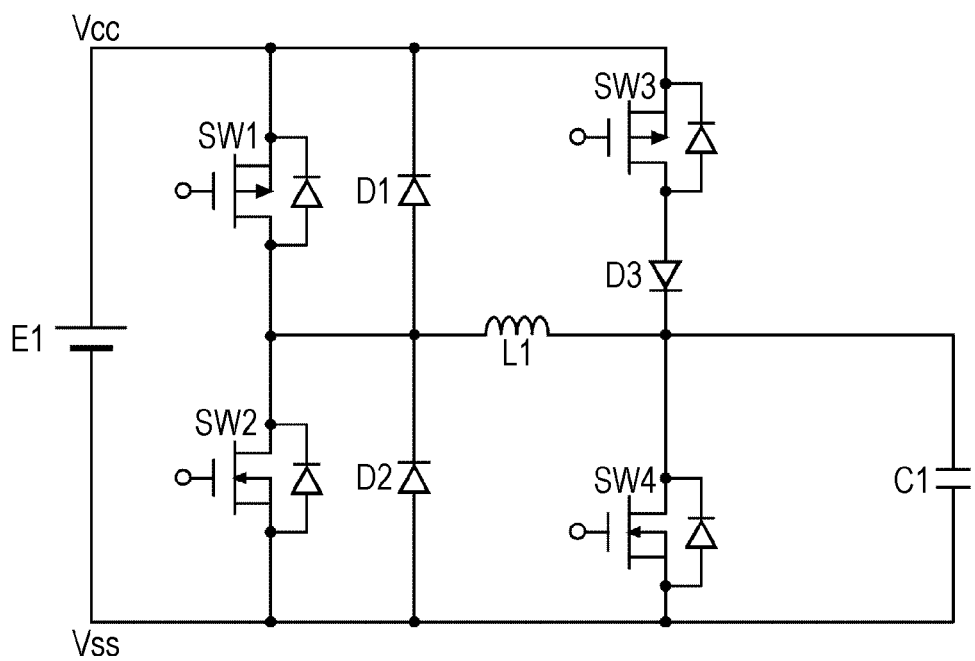
FIG. 20 illustrates the configuration of a gate driving apparatus according to modified example 5 of the first embodiment.
Figure 21:
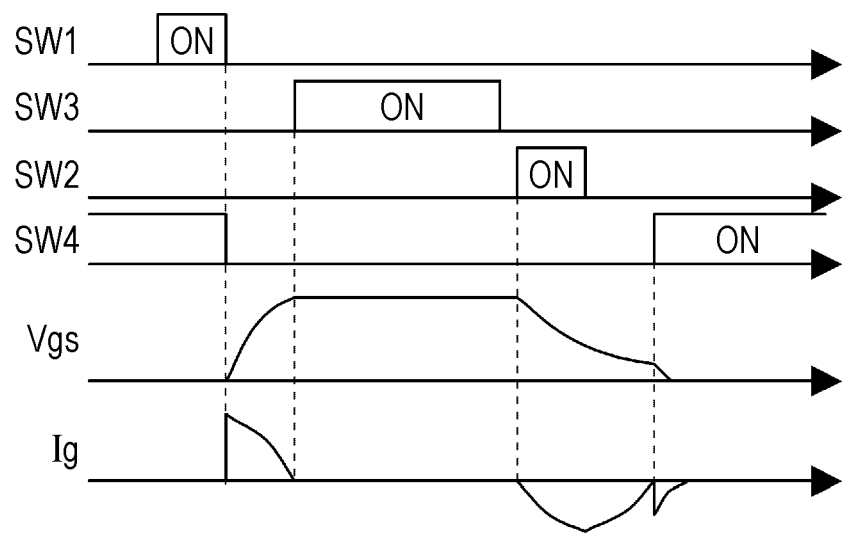
FIG. 21 schematically illustrates one example of a control method according to modified example 5 of the first embodiment.

FIG. 20 illustrates the configuration of a gate driving apparatus 100 according to modified example 5. The gate driving apparatus 100 according to modified example 5 has a configuration in which the second reverse-flow blocking diode D4 is omitted from the gate driving apparatus 100 illustrated in FIG. 1. FIG. 21 schematically illustrates one example of the temporal waveforms of control signals input to the switches SW1 to SW2, the temporal waveform of the gate voltage Vgs, and the temporal waveform of the gate current Ig according to modified example 5. The waveforms of control signals input to the first recovery switch SW1 and the first clamp switch SW3, the rise waveform of the gate voltage Vgs, and the waveform of the gate current Ig at the time of rising, the waveforms being illustrated in FIG. 21, are analogous to those in the example illustrated in FIG. 2. On the other hand, the waveform of the control signal input to the second clamp switch SW4, the fall waveform of the gate voltage Vgs, and the waveform of the gate current Ig at the time of falling, the waveforms being illustrated in FIG. 21, are different from those in the example illustrated in FIG. 2. In the example illustrated in FIG. 21, the coil L1 is precharged before the gate voltage Vgs rises, whereas the coil L1 is not precharged before the gate voltage Vgs falls. Even in such a case, when the timing at which the second recovery switch SW2 is turned off is appropriately set, it is possible to suppress unwanted regenerative current or circulating current.

Figure 22:
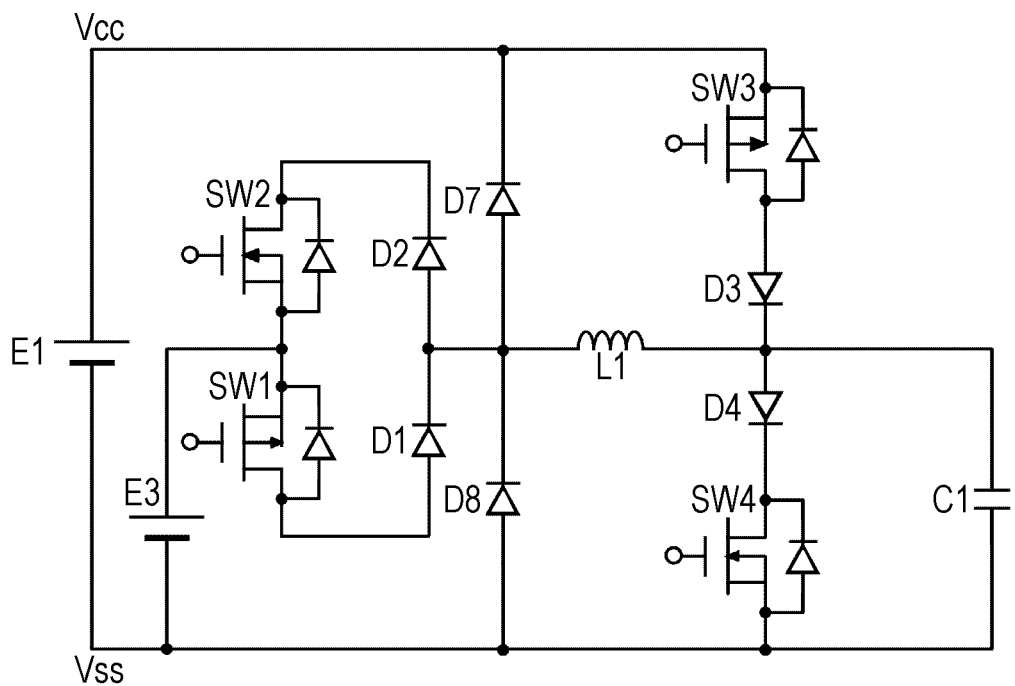
FIG. 22 illustrates the configuration of a gate driving apparatus according to modified example 6 of the first embodiment.

FIG. 22 illustrates the configuration of a gate driving apparatus 100 according to modified example 6. A gate driver 10 illustrated in FIG. 22 has a configuration in which an auxiliary power source E3, a first clamp diode D7, and a second clamp diode D8 are added to the gate driver 10 illustrated in FIG. 1. The auxiliary power source E3 generates a potential that is a half of the first reference potential Vcc generated by the power source E1. Hereinafter, the potential generated by the auxiliary power source E2 may be referred to as a "third reference potential", and a current path through which the third reference potential is supplied may be referred to as a "third reference potential line". In the example illustrated in FIG. 22, the reference potential of the lower potential-side of the auxiliary power source E3 is equal to the second reference potential Vss.

The third reference potential line is connected to a node between the first recovery switch SW1 and the second recovery switch SW2, and the auxiliary power source E3 serves as a power source for resonance. One end of the first recovery switch SW1 is connected to the third reference potential line, and another end of the first recovery switch SW1 is connected to an anode terminal of the first recovery diode D1. A cathode terminal of the first recovery diode D1 is connected to the input-side terminal of the coil L1. In the example illustrated in FIG. 22, the first recovery switch SW1 is a p-channel MOSFET, the source terminal of the p-channel MOSFET is connected to the third reference potential line, and the drain terminal thereof is connected to the anode terminal of the first recovery diode D1. The anode terminal of the first recovery diode D1 is connected to the drain terminal of the p-channel MOSFET, and the cathode terminal of the first recovery diode D1 is connected to the input-side terminal of the coil L1.

One end of the second recovery switch SW2 is connected to the third reference potential line, and another end of the second recovery switch SW2 is connected to a cathode terminal of the second recovery diode D2. An anode terminal of the second recovery diode D2 is connected to the input-side terminal of the coil L1. In FIG. 22, the second recovery switch SW2 is an re-channel MOSFET, the source terminal of the n-channel MOSFET is connected to the third reference potential line, and the drain terminal is connected to the cathode terminal of the second recovery diode D2. The cathode terminal of the second recovery diode D2 is connected to the drain terminal of the n-channel MOSFET, and the anode terminal of the second recovery diode D2 is connected to the input-side terminal of the coil L1.

The first clamp diode D7 is connected in a reverse direction between the first reference potential Vcc and the input-side terminal of the coil L1. The second clamp diode D8 is connected in a reverse direction between the input-side terminal of the coil L1 and the second reference potential Vss.

The first recovery switch SW1 and the first recovery diode D1 may also be provided in series between the third reference potential line and the input-side terminal of the coil L1. For example, the first recovery diode D1 may also be provided between the first recovery switch SW1 and the third reference potential line. The second recovery switch SW2 and the second recovery diode D2 may be provided in series between the third reference potential line and the input-side terminal of the coil L1. For example, the second recovery diode D2 may also be provided between the second recovery switch SW2 and the third reference potential line. In a gate driver according to a middle voltage method, a first recovery diode may be referred to as a "charging diode", and a second recovery diode may be referred to as a "discharging diode".

Figure 23:
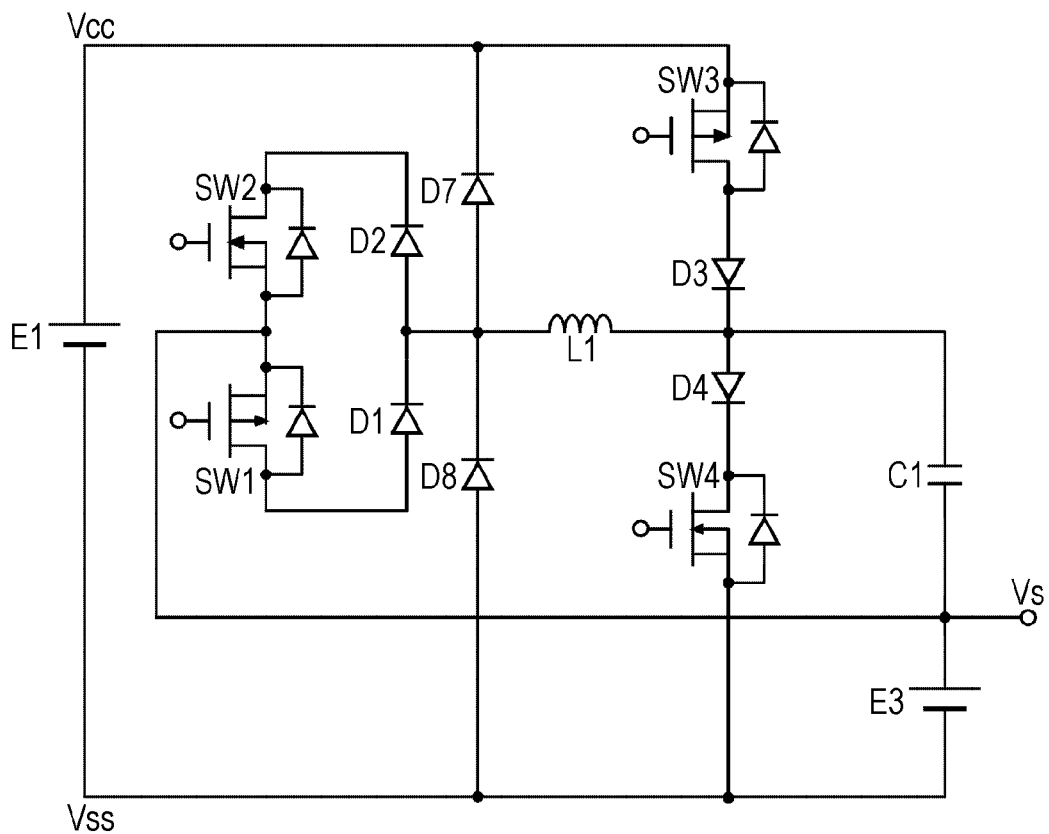
FIG. 23 illustrates the configuration of another gate driving apparatus according to modified example 6 of the first embodiment.

FIG. 23 illustrates another configuration of the gate driving apparatus 100 according to modified example 6. In the gate driving apparatus 100 illustrated in FIG. 23, the second reference potential Vss of the power source E1 is set to a negative potential. The auxiliary power source E3 is provided between the source terminal of the power switching element P and the second reference potential line. Thus, the potential of the auxiliary power source E3, not the second reference potential Vss from the second reference potential line, is supplied to the source terminal of the power switching element P. Also, the third reference potential line is connected to the auxiliary power source E3 and the source terminal. In the example in FIG. 23, the first reference potential Vcc of the power source E1 may be 20 V, the second reference potential Vss may be −5 V, and the voltage supplied by the auxiliary power source E3 may be 5 V. In this case, the gate driving apparatus 100 according to modified example 6 can apply a gate voltage of −5 V between the gate and the source of the power switching element P.

Figure 24:
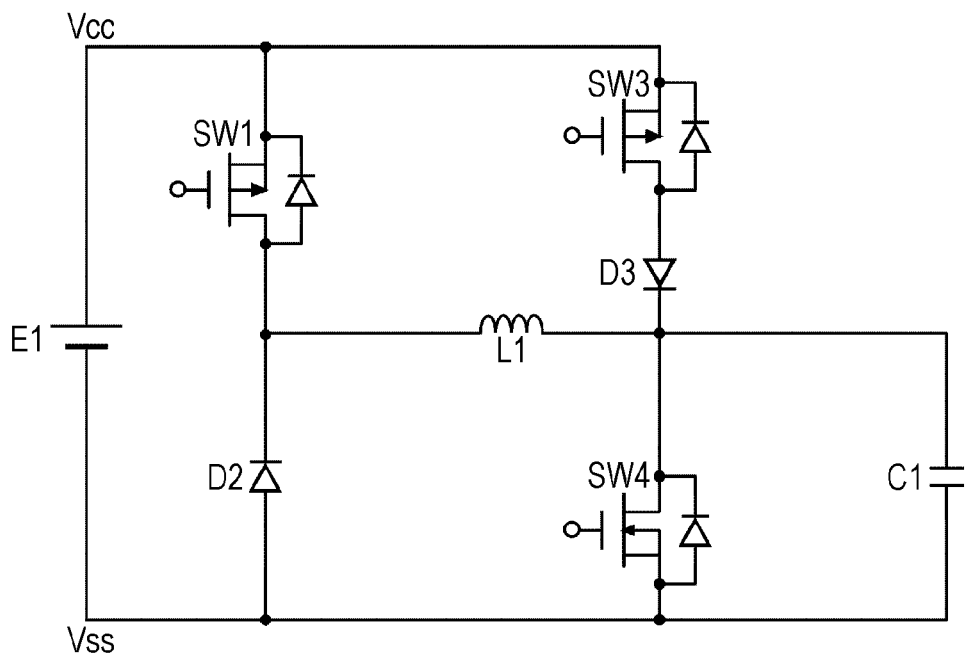
FIG. 24 illustrates the configuration of a gate driving apparatus according to modified example 7 of the first embodiment.

FIG. 24 illustrates the configuration of a gate driving apparatus 100 according to modified example 7. The gate driving apparatus 100 according to modified example 7 has a configuration in which the second recovery switch SW2, the first recovery diode D1, and the second reverse-flow blocking diode D4 are omitted from the gate driving apparatus 100 illustrated in FIG. 1.

Figure 25:
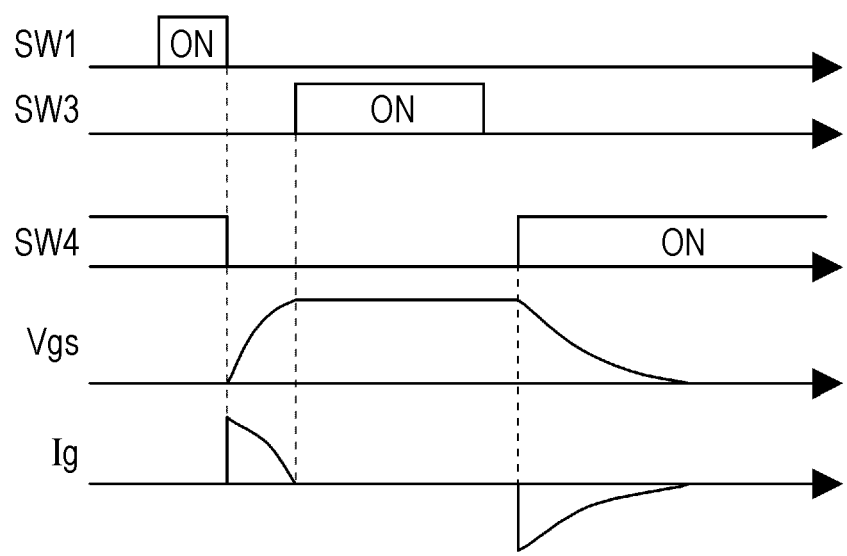
FIG. 25 schematically illustrates one example of a control method according to modified example 7 of the first embodiment.

FIG. 25 schematically illustrates one example of the temporal waveforms of control signals input to the switches SW1, SW3, and SW4, the temporal waveform of the gate voltage Vgs, and the temporal waveform of the gate current Ig according to modified example 7. The waveforms of the control signals input to the first recovery switch SW1 and the first clamp switch SW3, the rise waveform of the gate voltage Vgs, and the waveform of the gate current Ig at the time of rising, the waveforms being illustrated in FIG. 25, are analogous to those in the example illustrated in FIG. 2. On the other hand, the waveform of the control signal input to the second clamp switch SW4, the fall waveform of the gate voltage Vgs, and the waveform of the gate current Ig at the time of falling, the waveforms being illustrated in FIG. 25, are different from those in the example illustrated in FIG. 2. Specifically, in modified example 7, after the second clamp switch SW4 is turned on, the fall waveform of the gate voltage Vgs decreases according to an RC time constant. The gate driving apparatus 100 according to modified example 7 may have a configuration in which the first recovery switch SW1 and the second recovery diode D2 are omitted from the gate driving apparatus 100 illustrated in FIG. 1. In this case, the rise waveform of the gate voltage Vgs increases according to the RC time constant.

Of the gate driving apparatuses 100 according to modified examples 1 to 7, the gate driving apparatuses 100 in which at least one electrical element is omitted from the gate driving apparatus 100 illustrated in FIG. 1 can reduce the circuit area and the cost, compared with the example illustrated in FIG. 1.

Second Embodiment

A power converting circuit according to a second embodiment includes the gate driving apparatus 100 according to the first embodiment and a power switching element P. The description below will be given of an example in which the power converting circuit is a DC-DC converter and an example in which the power converting circuit is an inverter. In particular, the DC-DC converter or the inverter is mounted, for example, in a vehicle or an electricity storage system.

Figure 26:
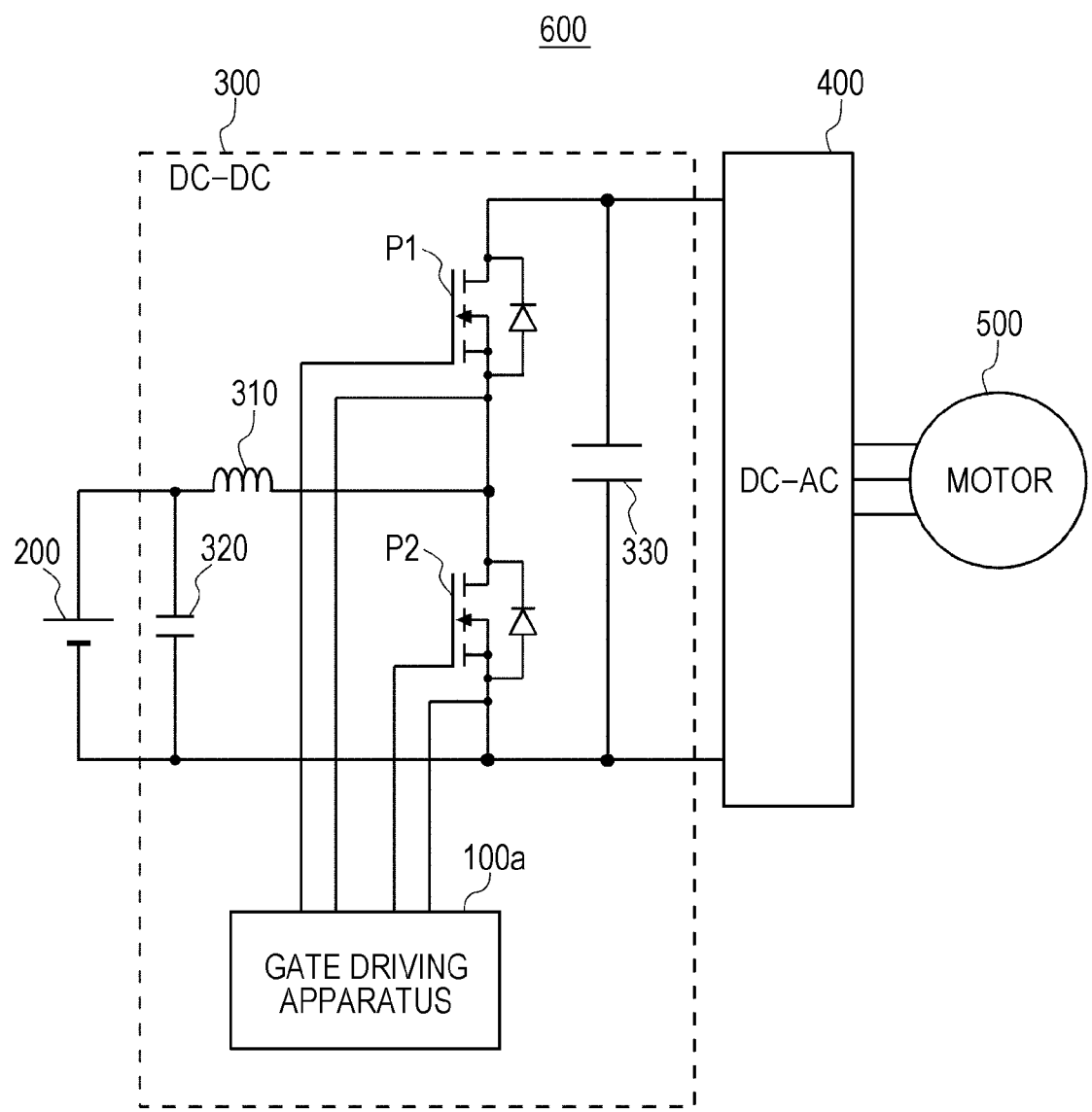
FIG. 26 illustrates a first example configuration of a motor drive system according to a second embodiment.

FIG. 26 illustrates a first example configuration of a motor drive system 600 including the gate driving apparatus 100 according to the first embodiment. The motor drive system 600 includes a battery 200, a DC-DC converter 300, an inverter (a DC-AC converter) 400, and a motor 500.

The DC-DC converter 300 has a coil 310, a capacitor 320, a high-side power switching element P1, a low-side power switching element P2, a capacitor 330, and a gate driving apparatus 100a. The high-side power switching element P1 and the low-side power switching element P2 are implemented by, for example, MOSFETs or IGBTs. The high-side power switching element P1 and the low-side power switching element P2 are driven by the gate driving apparatus 100a. The gate driving apparatus 100a is, for example, the gate driving apparatus 100 according to the first embodiment.

First, a description will be given of a voltage-increasing operation. The gate driving apparatus 100a controls the on/off state of the low-side power switching element P2, so that energy in the battery 200 moves to the capacitor 330 via the coil 310. The voltage of the capacitor 330 is increased relative to the voltage of the battery 200. The increased voltage is converted into an AC voltage by the inverter 400, and then the motor 500 is driven by the AC voltage.

Next, a description will be given of a voltage-reducing operation. AC power generated by the motor 500 is converted into DC power by the inverter 400, and then the DC power is stored in the capacitor 330. The gate driving apparatus 100a performs on/off control on the high-side power switching element P1, so that the energy stored in the capacitor 330 moves to the battery 200 via the coil 310. The voltage of the battery 200 is reduced relative to the voltage of the capacitor 330.

The gate driving apparatus 100a receives control signals from the control circuit 20, and then supplies drive signals to the gate terminals of the high-side power switching element P1 and the low-side power switching element P2. The high-side power switching element P1 and the low-side power switching element P2 are turned on/off by, for example, pulse width modulation (PWM) control.

Figure 27:
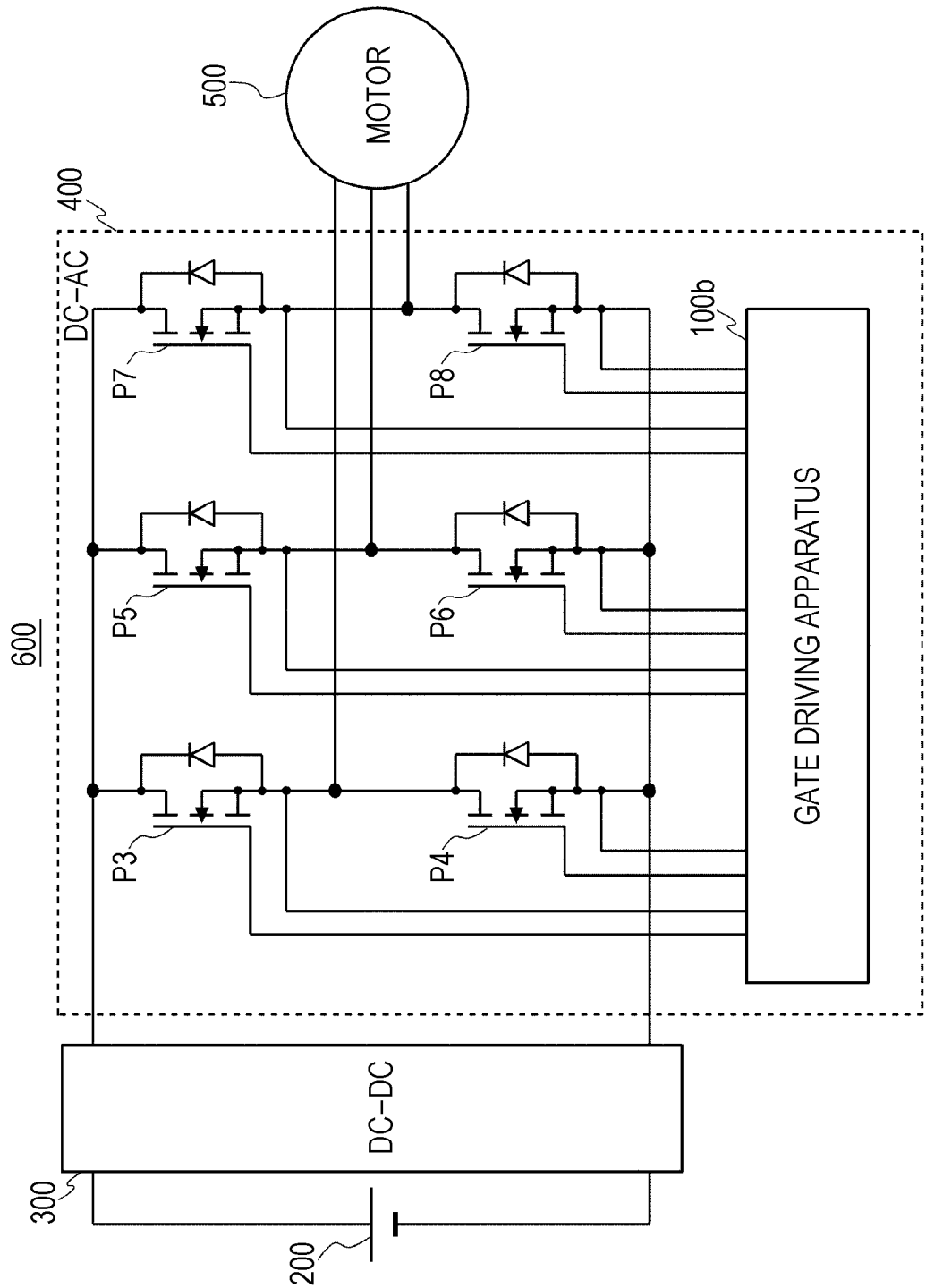
FIG. 27 illustrates a second example configuration of the motor drive system according to the second embodiment.

FIG. 27 illustrates a second example configuration of the motor drive system 600 including the gate driving apparatus 100 according to the first embodiment. In the second example configuration, the gate driving apparatus 100 according to the first embodiment is included in an inverter 400.

FIG. 27 illustrates an example of a three-phase inverter in which three legs are connected in parallel. The inverter 400 illustrated in FIG. 27 includes a U-phase high-side power switching element P3, a U-phase low-side power switching element P4, a V-phase high-side power switching element P5, a V-phase low-side power switching element P6, a W-phase high-side power switching element P7, a W-phase low-side power switching element P8, and a gate driving apparatus 100b. The six power switching elements P3 to P8 are connected in a three-phase configuration. The six power switching elements P3 to P8, connected in the bridge configuration, are implemented by, for example, MOSFETs or IGBTs. The power switching elements P3 to P8 are driven by the gate driving apparatus 100b. The gate driving apparatus 100b is, for example, the above-described gate driving apparatus 100 according to the first embodiment.

The six power switching elements P3 to P8, connected in the three-phase bridge configuration, are switched in accordance with drive signals supplied from the gate driving apparatus 100b. Through the switching, the six power switching elements P3 to P8, connected in the three-phase bridge configuration, converts DC power, supplied from a DC-DC converter 300, into AC power having a variable voltage and a variable frequency, and then supplies the AC power to a motor 500.

The gate driving apparatus 100b receives PWM control signals from the control circuit 20, and then supplies drive signals to the gate terminals of the six power switching elements P3 to P8 connected in the three-phase bridge configuration. The six power switching elements P3 to P8 are turned on/off by, for example, PWM control.

The first example configuration illustrated in FIG. 26 and the second example configuration illustrated in FIG. 27 can be used in combination. That is, the DC-DC converter 300 and the inverter 400 in the motor drive systems 600 may each have the gate driving apparatus 100 according to the first embodiment. When the voltage of the battery 200 and the voltage of the inverter 400 are designed to be the same, the DC-DC converter 300 may also be omitted.

Figure 28:
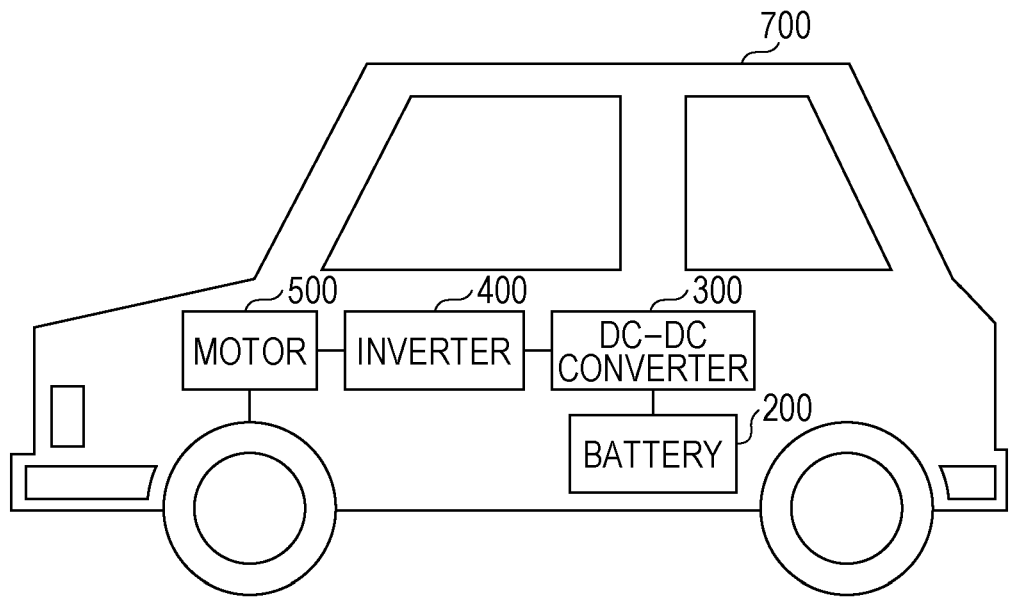
FIG. 28 illustrates an example configuration of a vehicle according to the second embodiment.

FIG. 28 illustrates an example configuration of a vehicle 700 including the motor drive system 600 illustrated in FIG. 26 or 27. The vehicle 700 illustrated in FIG. 28 is, for example, a hybrid vehicle (HV), a plug-in hybrid vehicle (PHV), or an electric vehicle (EV) having the motor 500 for driving. The motor 500 is not limited to a self-propelled high-power motor and may be a drive assisting motor installed in a mild hybrid vehicle. The motor 500 is, for example, a synchronous electric motor.

The vehicle 700 illustrated in FIG. 28 has a battery 200, a DC-DC converter 300, an inverter 400, and a motor 500. The battery 200 may be, for example, a battery, such as a lithium-ion battery or a nickel metal hydride battery. The battery 200, the DC-DC converter 300, the inverter 400, and the motor 500 may have the configuration illustrated in FIG. 26 or 27. When the vehicle 700 has an energy regeneration function during deceleration, the DC-DC converter 300 and the inverter 400 may be a bidirectional DC-DC converter and an inverter.

In the vehicle 700, control signals may also be supplied from an electronic control unit (ECU) to the gate driving apparatus 100a in FIG. 26 or the gate driving apparatus 100b in FIG. 27 via a controller area network (CAN).

Figure 29:
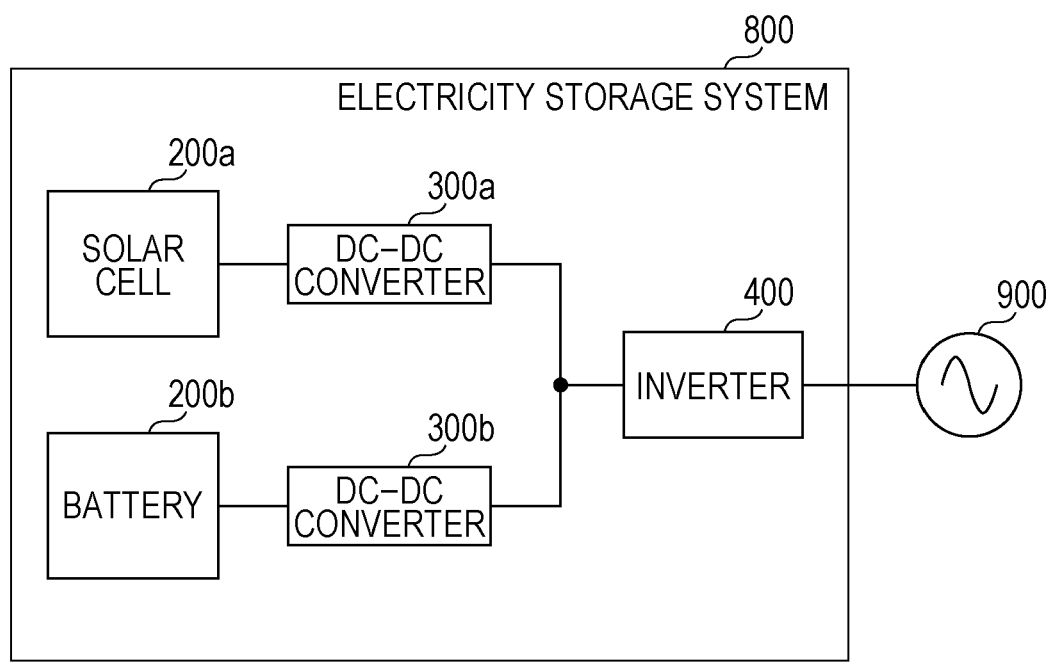
FIG. 29 illustrates an example configuration of an electricity storage system according to the second embodiment.

FIG. 29 illustrates an example configuration of an electricity storage system 800 including the gate driving apparatus 100 according to the first embodiment. The electricity storage system 800 illustrated in FIG. 29 includes a solar cell 200a, a battery 200b, a DC-DC converter 300a, a DC-DC converter 300b, and an inverter 400. DC power generated by the solar cell 200a is converted into DC power having a predetermined voltage by the DC-DC converter 300a. The DC power is converted by the inverter 400 into AC power, which is output to a system 900. Alternatively, the DC power is converted by the DC-DC converter 300b into DC power having a voltage for electricity storage, and then the DC power is then stored in the battery 200b.

At least one of the DC-DC converter 300a and the DC-DC converter 300b may be the DC-DC converter 300 having the configuration illustrated in FIG. 26. The inverter 400 may also be the inverter 400 having the configuration illustrated in FIG. 27.

The battery 200b and the DC-DC converter 300b may also be omitted. That is, the gate driving apparatus 100 according to the first embodiment can be applied to a photovoltaic system that has no electricity storage function. The solar cell 200a and the DC-DC converter 300a may also be omitted. That is, the gate driving apparatus 100 according to the first or second embodiment can be applied to an electricity storage system that has no electricity generation function.

Since the motor drive system 600, the vehicle 700, or the electricity storage system 800 has the gate driving apparatus 100 according to the first embodiment, the switching characteristics of the power switching elements included in the motor drive system 600, the vehicle 700, or the electricity storage system 800 are improved. Accordingly, the operation characteristics of the entire motor drive system 600, the entire vehicle 700, or the entire electricity storage system 800 are improved.

The present disclosure has been described above in conjunction with the particular embodiments. The first and second embodiments are merely exemplary and illustrative. Various modified examples are possible to the components and control processes described above in conjunction with the first and second embodiments. Such modified examples are also encompassed within the scope of the present disclosure.

For example, the coil L1 can also be replaced with the parasitic inductance of a wire connected to the gate terminal. In this case, a series resonance circuit is formed.

The first recovery switch SW1 and the second recovery switch SW2 may also be implemented by a single integrated-circuit (IC) chip. The first recovery switch SW1, the second recovery switch SW2, and the coil L1 may also be implemented by a single IC chip.

The present disclosure also includes circuits that can realize the features of the present disclosure, as well as the above-described circuit configurations. For example, the present disclosure also includes a circuit in which an element, such as a switching element (a transistor), a resistance element, or a capacitance element, is connected in series or in parallel, with another element, as far as functions that are the same as or similar to those of the circuit configuration described above are realized. In other words, the expression "connected" in the present disclosure is not limited to a case in which two terminals, or two nodes, are connected in series and also includes a case in which two terminals, or two nodes, are connected via an element, as far as the same or similar functions can be realized.

For example, a driving apparatus may drive a voltage-controlled switching element in accordance with signals generated by resonance. The driving apparatus may include a resonance coil precharged before current flows to a control terminal of the switching element, and a diode provided in a forward direction on a path provided between an output-side terminal of the resonance coil, the output-side terminal being connected to the control terminal, and a reference potential.

For example, the driving apparatus may input a signal to the control terminal so that, before the voltage of the control terminal reaches a fixed voltage to which it is to be fixed after switching, an absolute value of current that flows to the control terminal reaches a peak value in the increasing direction thereof.

For example, the driving apparatus may precharge the resonance coil by passing current to the resonance coil from the reference potential and may provide electrical connection between the reference potential and the output-side terminal of the resonance coil through the path.

For example, a driving apparatus may drive a voltage-controlled switching element in accordance with signals generated by resonance and may include: a resonance coil precharged before current flows to a control terminal of the switching element; a first diode whose coil side is provided as a cathode side on a path provided between an output-side terminal of the resonance coil, the output-side terminal being connected to the control terminal, and a high potential side reference potential; a second diode whose coil side is provided as an anode side on a path provided between the output-side terminal of the resonance coil, the output-side terminal being connected to the control terminal; and a lower potential-side reference potential.

A driving apparatus may include, for example: a coil connected in series with a control terminal of a voltage-controlled switching element; a first switch provided between a first potential that is one potential of a power source in the driving apparatus and an input-side terminal of the coil; a first diode provided in a reverse direction between a second potential that is another potential of the power source and the input-side terminal of the coil; a second switch provided between the second potential and an output-side terminal of the coil; a third switch provided between the first potential and the output-side terminal of the coil; a second diode interposed in a forward direction between the third switch and the output-side terminal of the coil; and a control circuit that controls the first switch, the second switch, and the third switch. The control circuit may create a state in which the first switch and the second switch are on and the third switch is off, before switching of the switching element.

In the driving apparatus, for example, the control circuit may control the first switch, the second switch, and the third switch so that, before the voltage of the control terminal reaches a fixed voltage to which it is to be fixed after switching, an absolute value of current that flows to the control terminal reaches a peak value in the increasing direction thereof.

For example, the driving apparatus may fix the control terminal to a negative voltage after switching the switching element.

For example, an electric power converter may be an electric power converter that converts input electric power into output electric power and may include at least one voltage-controlled switching element and a driving apparatus that drives the voltage-controlled switching element.

The present disclosure is applicable to, for example, a driving apparatus for a power switching element used for a DC-DC converter or an inverter.

While the present disclosure has been described with respect to exemplary embodiments thereof, it will be apparent to those skilled in the art that the disclosure may be modified in numerous ways and may assume many embodiments other than those specifically described above. Accordingly, it is intended by the appended claims to cover all modifications of the disclosure that fall within the true spirit and scope of the disclosure.

What is claimed is:

1. A driving apparatus for driving a switching element including a control terminal, the driving apparatus comprising:
   a first potential line that applies a first potential;
   a second potential line that applies a second potential lower than the first potential;
   a coil including a first terminal and a second terminal, the second terminal being connected to the control terminal of the switching element;
   a charging switch, connected between the first potential line and the first terminal of the coil, to turn on or off electrical connection between the first potential line and the coil;
   a clamp switch, provided between the first potential line and the second terminal of the coil, to turn on or off electrical connection between the first potential line and the control terminal of the switching element;
   a reverse-flow blocking diode, connected in series with the clamp switch between the first potential line and the second terminal of the coil, to block current from the second terminal of the coil toward the first potential line; and
   a control circuit that controls the charging switch and the clamp switch.

2. The driving apparatus according to claim 1, wherein
   the switching element further includes a first conductive terminal, a second conductive terminal, and a capacitor between the control terminal and the first conductive terminal; and
   the coil and the capacitor generates resonance current flowing therebetween.

3. The driving apparatus according to claim 1, wherein, before current flows from the driving apparatus to the control terminal of the switching element, the control circuit causes energy to be stored in the coil.

4. The driving apparatus according to claim 1, wherein the control circuit outputs control signals, and
   the control signals turn on the charging switch, and then turn off the charging switch after energy is stored in the coil.

5. The driving apparatus according to claim 4, wherein the control signals further turn on the clamp switch, after the charging switch is turned off and after a potential of the control terminal of the switching element reaches the first potential.

6. The driving apparatus according to claim 1, wherein the clamp switch comprises a parasitic diode that passes current from the second terminal of the coil toward the first potential line.

7. The driving apparatus according to claim 1, wherein
   the clamp switch is a first clamp switch;
   the driving apparatus further comprises
      a charging diode, connected between the second potential line and the first terminal of the coil, to pass current from the second potential line to the first terminal of the coil, and
      a second clamp switch, provided between the second potential line and the second terminal of the coil, to turn on or off electrical connection between the second potential line and the control terminal of the switching element; and
   the control circuit further controls the second clamp switch.

8. The driving apparatus according to claim 7, wherein the control circuit outputs control signals, and
   the control signals turn on the charging switch and the second clamp switch, and then turn off the charging switch and the second clamp switch after energy is stored in the coil.

9. The driving apparatus according to claim 8, wherein
the switching element further includes a first conductive terminal, a second conductive terminal, and a capacitor between the control terminal and the first conductive terminal;
when the charging switch and the second clamp switch are on, current flows from the first potential line to the second potential line via the charging switch, the coil, and the second clamp switch; and
when the charging switch and the second clamp switch are off, current flowing through the coil charges the capacitor.

10. The driving apparatus according to claim 8, wherein the control signals further turn on the first clamp switch, after the charging switch and the second clamp switch are turned off and after a potential of the control terminal of the switching element reaches the first potential.

11. The driving apparatus according to claim 7, wherein
the reverse-flow blocking diode is a first reverse-flow blocking diode;
the driving apparatus further comprises
a discharging switch, connected between the second potential line and the first terminal of the coil, to turn on or off electrical connection between the second potential line and the coil,
a discharging diode, connected between the first potential line and the first terminal of the coil, to pass current from the first terminal of the coil to the first potential line, and
a second reverse-flow blocking diode, connected in series with the second clamp switch between the second potential line and the second terminal of the coil, to block current from the second potential line toward the second terminal of the coil; and
the control circuit further controls the discharging switch.

12. The driving apparatus according to claim 11, wherein, before current flows from the control terminal of the switching element to the driving apparatus, the control circuit causes energy to be stored in the coil.

13. The driving apparatus according to claim 11, wherein the control circuit outputs control signals, and
the control signals turn on the discharging switch and the first clamp switch, and then turn off the discharging switch and the first clamp switch after energy is stored in the coil.

14. The driving apparatus according to claim 13, wherein
the switching element further includes a first conductive terminal, a second conductive terminal, and a capacitor between the control terminal and the first conductive terminal;
when the discharging switch and the first clamp switch are on, current flows from the first potential line to the second potential line via the first clamp switch, the coil, and the discharging switch; and
when the discharging switch and the first clamp switch are off, current flowing through the coil discharges the capacitor.

15. The driving apparatus according to claim 13, wherein the control signals further turn on the second clamp switch, after the discharging switch and the first clamp switch are turned off and after a potential of the control terminal of the switching element reaches the second potential.

16. The driving apparatus according to claim 1, wherein
the switching element further comprises a first conductive terminal and a second conductive terminal; and
the driving apparatus further comprises an auxiliary power source, provided between the second potential line and the first conductive terminal of the switching element, to increase a potential of the first conductive terminal of the switching element to be higher than a potential of the second potential line.

17. An electric power converter for converting input electric power into output electric power, the electric power converter comprising:
a switching element; and
the driving apparatus according to claim 1, the driving apparatus driving the switching element.

18. A driving apparatus for driving a switching element including a control terminal, the driving apparatus comprising:
a first potential line that applies a first potential;
a second potential line that applies a second potential lower than the first potential;
a coil including a first terminal and a second terminal, the second terminal being connected to the control terminal of the switching element;
a discharging switch, connected between the second potential line and the first terminal of the coil, to turn on or off electrical connection between the second potential line and the coil;
a clamp switch, provided between the second potential line and the second terminal of the coil, to turn on or off electrical connection between the second potential line and the control terminal of the switching element;
a reverse-flow blocking diode, connected in series with the clamp switch between the second potential line and the second terminal of the coil, to block current from the second potential line toward the second terminal of the coil; and
a control circuit that controls the discharging switch and the clamp switch.

19. The driving apparatus according to claim 18, wherein, before current flows from the control terminal of the switching element to the driving apparatus, the control circuit causes energy to be stored in the coil.

20. A driving apparatus for driving a switching element including a control terminal, the driving apparatus comprising:
a first potential line that applies a first potential;
a second potential line that applies a second potential lower than the first potential;
a third potential line that applies a third potential lower than the first potential and higher than the second potential;
a coil including a first terminal and a second terminal, the second terminal being connected to the control terminal of the switching element;
a charging switch, provided between the third potential line and the first terminal of the coil, to turn on or off electrical connection between the third potential line and the coil;
a clamp switch, provided between the first potential line and the second terminal of the coil, to turn on or off electrical connection between the first potential line and the control terminal of the switching element;
a reverse-flow blocking diode, connected in series with the clamp switch between the first potential line and the second terminal of the coil, to block current from the second terminal of the coil toward the first potential line; and
a control circuit that controls the charging switch and the clamp switch.

* * * * *